(12) United States Patent
Bogursky et al.

(10) Patent No.: US 8,031,485 B2
(45) Date of Patent: Oct. 4, 2011

(54) ELECTRONIC SHIELDING APPARATUS AND METHODS

(75) Inventors: Robert Bogursky, Encinitas, CA (US); Kenneth Krone, San Diego, CA (US); Frederick W. Grabau, Temecula, CA (US); Peter Bellantoni, San Diego, CA (US); Mark Saunders, San Diego, CA (US)

(73) Assignee: Autosplice, Inc., San Diego, CA (US)

(*) Notice: Subject to any disclaimer, the term of this patent is extended or adjusted under 35 U.S.C. 154(b) by 815 days.

(21) Appl. No.: 11/899,808

(22) Filed: Sep. 7, 2007

(65) Prior Publication Data

US 2009/0067149 A1    Mar. 12, 2009

(51) Int. Cl.
*H05K 9/00* (2006.01)
(52) U.S. Cl. .......................... 361/816; 361/800; 361/818
(58) Field of Classification Search ................ 361/816, 361/818, 800, 799; 174/35 R, 51, 138 E
See application file for complete search history.

(56) References Cited

U.S. PATENT DOCUMENTS

| | | | |
|---|---|---|---|
| 5,151,769 A | 9/1992 | Immorlica, Jr. et al. | |
| 5,177,856 A | 1/1993 | Rogers et al. | |
| 5,706,952 A | 1/1998 | Bianca et al. | |
| 5,731,964 A * | 3/1998 | Kitakubo et al. | 361/816 |
| 5,895,884 A * | 4/1999 | Davidson | 174/372 |
| 5,938,996 A | 8/1999 | Bianca et al. | |
| 6,016,918 A * | 1/2000 | Ziberna | 206/714 |
| 6,202,853 B1 * | 3/2001 | Bianca et al. | 206/713 |
| 6,294,729 B1 | 9/2001 | Kaplo | |
| 6,319,750 B1 | 11/2001 | Heffner et al. | |
| 6,501,016 B1 | 12/2002 | Sosnowski | |
| 6,552,261 B2 | 4/2003 | Shlahtichman et al. | |
| 6,621,158 B2 | 9/2003 | Martin et al. | |
| 6,636,406 B1 | 10/2003 | Anthony | |
| 6,768,654 B2 | 7/2004 | Arnold et al. | |
| 6,833,031 B2 | 12/2004 | Arnold | |
| 6,873,031 B2 | 3/2005 | McFadden et al. | |
| 6,885,561 B1 | 4/2005 | Hashemi et al. | |
| 6,909,615 B2 | 6/2005 | Arnold et al. | |
| 7,109,410 B2 | 9/2006 | Arnold et al. | |
| 7,127,805 B2 | 10/2006 | Watson | |
| 7,129,422 B2 | 10/2006 | Arnold | |
| 7,135,643 B2 | 11/2006 | Haaster et al. | |
| 7,183,498 B2 * | 2/2007 | Ogura et al. | 174/387 |
| D549,231 S * | 8/2007 | Doyle et al. | D14/432 |
| 7,488,902 B2 * | 2/2009 | English et al. | 174/382 |
| 7,508,684 B2 * | 3/2009 | Chen et al. | 361/818 |
| 2002/0102835 A1 | 8/2002 | Stucchi et al. | |
| 2002/0109218 A1 | 8/2002 | Akram | |
| 2003/0002271 A1 | 1/2003 | Nurminem | |
| 2007/0139904 A1 * | 6/2007 | English et al. | 361/818 |
| 2007/0199738 A1 * | 8/2007 | Gabower | 174/350 |

FOREIGN PATENT DOCUMENTS

WO WO 2007/044152 4/2007
* cited by examiner

*Primary Examiner* — Hung S Bui
(74) *Attorney, Agent, or Firm* — Gazdzinski & Associates, PC

(57) ABSTRACT

A shielding apparatus useful in the attenuation of electronic noise or spurious electric signals is disclosed. In one embodiment, the shielding apparatus is encapsulated with an electronic component such as an integrated circuit. At least parts of the apparatus are formed using a selective metal deposition process (e.g., electroforming) that increases manufacturing efficiency and provides enhanced mechanical and structural features, as well as reduced cost. In another embodiment, the shielding apparatus comprises an array. Methods of manufacturing and utilizing the shielding apparatus are also disclosed.

30 Claims, 28 Drawing Sheets

SECTION A-A

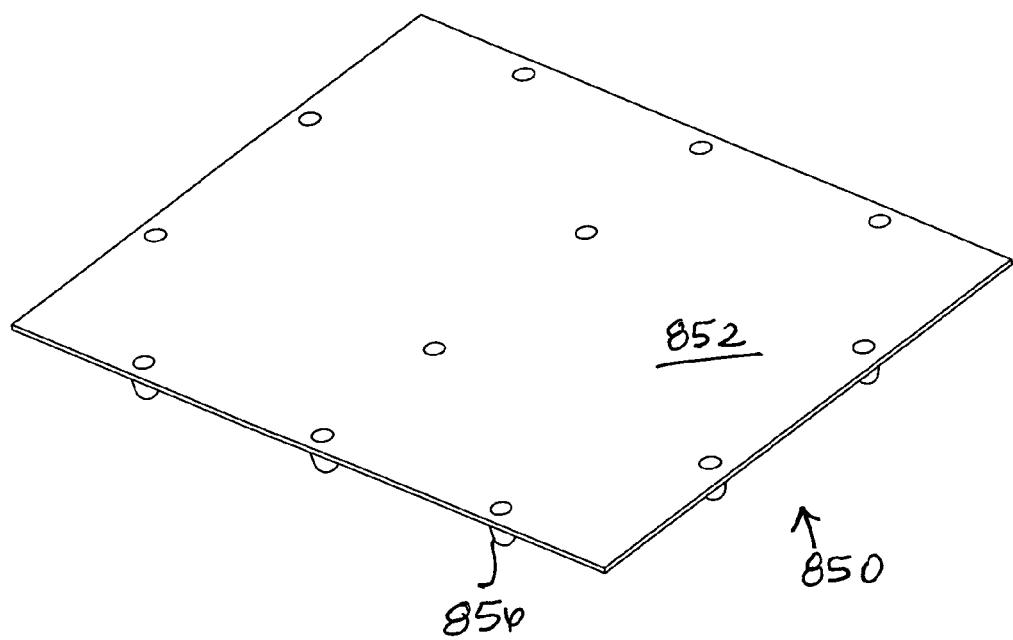
FIG. 8E
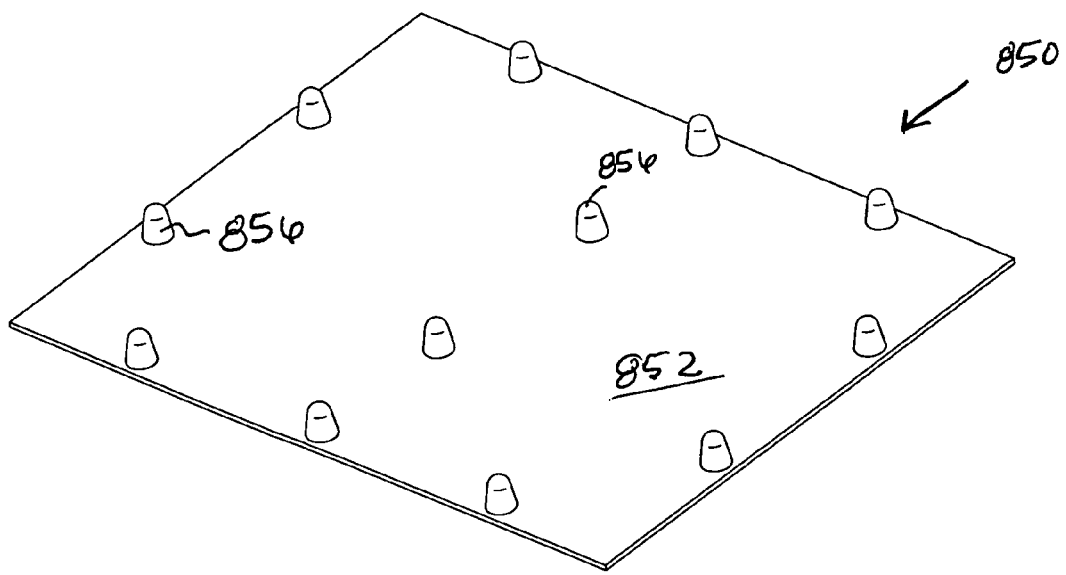

|  |  | dB Attenuation | | |
|---|---|---|---|---|
| Coating | Thickness | 100 MHz | 1GHz | 10 GHz |
| All-Over Plating | 40-50 µ" (1.0-1.25 µm) | 108 | 120 | 87 |
| Selective Plating | 80-100 µ" (2.0-2.5 µm) | 83 | 71 | 62 |
| Copper Paint | 0.001" (0.025 mm) | 63 | 70 | 63 |
| Copper-Silver Hybrid Paint | 0.001" (0.025 mm) | 65 | 69 | 70 |
| Silver Paint | 0.005" (0.0125 mm) | 73 | 62 | 55 |
| Cu – Stainless Vacuum Deposition | 20 µ" (0.5 µm) | 46 | 48 | 62 |
| Al Vapor Deposition | 20 µ" (0.5 µm) | 42 | 46 | 35 |

FIG. 9

AOE = All-Over Electroless Plating

ELECTRONIC SHIELDING APPARATUS AND METHODS

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

The present invention relates to the field of electrical devices and electronics, and specifically in one embodiment to methods for reducing the effects of spurious electrical signals on electronic components.

DESCRIPTION OF RELATED TECHNOLOGY

In electronic devices such as e.g., cellular telephones and other wireless applications, it is often necessary to shield the printed circuit board and/or other electronic components to limit or prevent emissions caused or received by such components. These "spurious" signals (typically radio frequency or electromagnetic energy of a fairly high frequency, but may also comprise other types of energy or radiation) may result for any number of different reasons, which are beyond the scope of the present discussion. However, these emissions represent a significant source of possible interference with the operation of the components or the device at large, and hence are of significant concern.

In typical prior art solutions to electronic noise or signal shielding, plastic casings surrounding the electronic component are typically covered with metal plating, metallized paint, or other metallic coatings. In other applications, metal filled plastics or elastomers are used to achieve sufficient shielding. Another commonly used method is to place a metal shield (typically a copper, steel, or other alloy) over the printed circuit board (PCB) or sections of the board containing the electronic components that emit offending signals, or which must otherwise be shielded from external signals.

Many specific examples of technologies to ostensibly reduce spurious electrical signals are evidenced in the prior art. For example, U.S. Pat. No. 5,151,769 to Immorlica, Jr., et al. issued on Sep. 29, 1992 and entitled "Optically patterned RF shield for an integrated circuit chip for analog and/or digital operation at microwave frequencies" relates to an RF shield for an individual or a collection of integrated circuit chips in a module containing a plurality of hybrid interconnected chips generating interfering RF fields that would interfere with operation of that chip if unshielded. The chips in the module may function in the analog and/or digital mode. The RF shield comprises separate metallizations under and over the chip, the two metallizations being interconnected by a line of discrete electrically conductive vias forming cage-like sides to complete an electrically conductive enclosure about the chip. The vias are spaced closely enough to prevent the escape or entry of RF waves at the frequencies of interest. The RF shield is advantageously fabricated using metallizations and vias that are optically patterned by the same process steps used to effect hybrid interconnection of the chips.

U.S. Pat. No. 5,177,856 to Rogers, et al. issued Jan. 12, 1993 and entitled "Method of making a shield for a printed circuit board" discloses a shielding assembly for a circuit board. This assembly is formed by providing a substantially flat piece of metal that will be used to form a shield assembly. A template is obtained indicating locations of folds and tabs. The folds are at locations that will enable the tabs to be located in the holes on the circuit board. The template is used to etch grooves and to etch tabs. This can be used to form a shielding assembly.

U.S. Pat. No. 6,319,740 to Heffner, et al. issued Nov. 20, 2001 and entitled "Multilayer protective coating for integrated circuits and multi-chip modules and method of applying same" discloses a method of forming a multilayer opaque coating on an integrated circuit or multi-chip module. First, an opaque coating composition is heated to a molten state and the molten opaque coating composition is applied so as to form an opaque coating that overlies active circuitry on the surface of the integrated circuit or multi-chip module, to prevent optical and radiation based inspection and reverse engineering of the active circuitry. Further coatings are applied over the opaque coating to shield the active circuitry of the integrated circuit or multi-chip module from the adverse affects of electromagnetic interference and/or high energy radiation.

U.S. Pat. No. 6,621,158 to Martin, et al. issued Sep. 16, 2003 and entitled "Package for sealing an integrated circuit die" discloses a die that is sealed with a cap. The seal can be hermetic or non-hermetic. If hermetic, a layer of glass or metal is formed in the surface of the die, and the cap has a layer of glass or metal at a peripheral area so that, when heated, the layers form a hermetic seal. A non-hermetic seal can be formed by bonding a cap with a patterned adhesive. The cap, which can be silicon or can be a metal paddle, is electrically coupled to a fixed voltage to shield the part of the die.

U.S. Pat. No. 6,636,406 to Anthony issued Oct. 21, 2003 and entitled "Universal multi-functional common conductive shield structure for electrical circuitry and energy conditioning" discloses a layered common conductive shield structure with conductive pathways for energy and EMI conditioning and protection that also possesses a commonly shared and centrally positioned conductive pathway or electrode of the structure that can simultaneously shield and allow smooth energy interaction between grouped and energized conductive pathway electrodes. The invention of Anthony, when energized, allows the contained conductive pathways or electrodes to operate with respect to one another harmoniously, yet in an oppositely phased or charged manner, respectively. The invention of Anthony will also provide EMI filtering and surge protection while maintaining apparent even or balanced voltage supply between a source and an energy utilizing-load when placed into a circuit and energized. The shielded structure will also be able to simultaneous and effectively provide energy conditioning functions that include bypassing, energy and signal decoupling, energy storage, continued balance in SSO (Simultaneous Switching Operations) states and all without contributing disruptive energy parasitics back into the circuit system.

U.S. Pat. No. 6,873,031 to McFadden, et al. issued Mar. 29, 2005 and entitled "Shielding device used for various components mounted on circuit board aligned with selectively cut areas" discloses a shielding device in which a layer of deformable electrically conductive material is conformed to fit over the components on the board. In one embodiment of the invention the deformable material is conductive foam, such as metallized foam. One or both sides of the foam layer can be covered with dielectric material. Portions of the dielectric material and foam can be removed, such as from the bottom layer to create insulating slants over the components.

Cuts in the deformable material lead to compression only over the component. The board can be placed over the components, which are received in recesses in the shield which are either preformed or result from compression of the deformable material at the location of the components. In one embodiment of the invention, regions of conductive layer are removed and the layer is placed over the components. A top layer is placed thereover. The invention also relates to the method of foaming the board level shield. United States Patent Publication No. 20020102835 to Stucchi, et al. published Aug. 1, 2002 and entitled "Method of fabrication and device for electromagnetic-shielding structures in a damascene-based interconnect scheme" discloses a shielded interconnect and a method of manufacturing a shielded interconnect implemented in a damascene back-end-of-line technology to form electromagnetically shielded interconnects. The standard metallization of the damascene technology is used as a core layer in a coaxial interconnect line. Prior to filling the via and trench openings in the damascene stack with this standard metallization, conductive and dielectric layers are formed as shield and insulator layers, respectively, of the coaxial interconnect line.

United States Patent Publication No. 20020109218 to Akram, published Aug. 15, 2002 and entitled "Method and apparatus for packaging flip chip bare die on printed circuit boards" discloses an apparatus and a method for providing a fully protective package for a flip chip with a protective shield plate and an under fill encapsulant material. The apparatus comprises a semiconductor chip electrically connected by flip chip attachment to a substrate. A shield plate is placed in contact with a back surface of the semiconductor chip. An under fill encapsulant is disposed between the semiconductor chip and the shield plate, and the substrate. A globe top encapsulant may be applied about the periphery of the upper surface of the shield plate that extends to the substrate for additional protection and/or adherence.

United States Patent Publication No. 20030002271 to Nurminen, published Jan. 2, 2003 and entitled "Integrated EMC shield for integrated circuits and multiple chip modules" discloses a semiconductor package that has a die connected to a substrate with a transfer molding applied over the die. The transfer molding includes an electrically conductive material for forming an electromagnetic compatibility shield as an integral part thereof.

However, each of the foregoing methods suffers from one or more disabilities, including inter alia: (i) adding substantially to the cost of the shielded device, (ii) having limits in terms of durability, minimum size and area consumed, cost of manufacturing, and even aesthetics, (iii) dictating materials that can or cannot be used, and (iv) requiring existing printed circuit board designs or layouts to be altered due to the shape and style of the shielding solution that can be produced.

Moreover, there is substantial difficulty under the prior art in encapsulating the shielded device(s).

In addition, it has become necessary in certain applications including, e.g., Multi-Chip Modules ("MCMs"), for components in close proximity to be shielded from one another on the printed circuit board or other substrate (as opposed to being shielded from external electronic components). Prior art shielding components for MCM applications often introduce their own problems, such as difficulty in shield manufacture and excessive space consumption.

There is also a need for smaller and lower profile of the shielded device through, e.g., use of thinner shield walls.

Based on the foregoing, there is a salient need for improved shielding apparatus and methods that minimize the space required to provide the necessary level of shielding, and which are cost effective. In addition, it would be desirable to have a shielding solution that is disposed on the electrically active chips within an electronic component (e.g. an MCM component) or other devices requiring shielding, thereby eliminating the need for the device manufacturer (such as e.g., a cellular phone manufacturer or other miniature electronics or device or component producer) to consider shielding the design and construction of their product. Such an improved shielding solution would also ideally substantially maintain the electronic components' existing low vertical profile (i.e., height), and not significantly increase the effective size or footprint of the electronic component to be shielded.

SUMMARY OF THE INVENTION

In a first aspect of the invention, shielding apparatus useful in the attenuation of signals (e.g., spurious noise) is disclosed. In one embodiment, the shielding apparatus comprises: a top wall; and a side wall disposed substantially around at least a portion of the periphery of said top wall. A divider substantially separating at least a portion of said shielding apparatus into two or more cavities; and/or a plurality of standoff features, may also be used. In one variant, the shielding apparatus comprises a selectively metallized (e.g., electroformed) metallic structure with the thickness of said top and/or side wall (and optionally said divider wall and/or said plurality of standoff features) is less than or equal to about 0.10 mm. In another variant, yet smaller thicknesses (e.g., down to approximately 0.025 mm) are used. In yet another variant, said plurality of standoff features comprises one or more substantially rounded edges.

In another variant, the shield apparatus comprises only an electroformed top wall. This may be useful in, inter alia, applications where only substantially directional shielding (i.e., through the top surface of an IC or other device) is needed.

In a second aspect of the invention, an encapsulated electronic component is disclosed. In one embodiment, the component comprises: an electronic component; and a shield structure, wherein said electronic component and said shield structure are substantially encased within an encapsulant compound. In one variant, said electronic component comprises a multi-chip module (MCM), which comprises a ceramic, glass/epoxy or other substrate. In another variant, said shield structure is at least partly electroformed, and comprises: a top wall; a side wall running substantially around the periphery of said top wall; a divider wall separating said shielding apparatus into two or more cavities; and a plurality of standoff features.

In a third aspect of the invention, shielding apparatus is disclosed. In one embodiment, the shielding apparatus comprises: a plurality of at least partly electroformed shield structures; wherein at least one of said plurality of shield structures is attached to at least one other of said plurality. In one variant, each of said plurality of shield structures has a height less than or equal to approximately 0.6 mm.

In a fourth aspect of the invention, a method of manufacturing a shield apparatus is disclosed. In one embodiment, said shield apparatus comprises a top wall, a sidewall disposed substantially about at least a portion of the periphery of said top wall, and a plurality of standoffs, and said method comprises: masking at least a portion of a component (e.g., a three-dimensional mandrel or other such component) used to form the shield apparatus; and selectively metallizing at least a portion of said shield apparatus in areas that are not masked. In one variant, said shield structure apparatus comprises a shield structure array, said act of selectively metallizing comprises electroforming each component of said array substantially simultaneously. In another variant, said method further comprises separating said components from one another after said electroforming has been completed.

In another variant, said act of selectively metallizing produces said shield structure apparatus such that said top wall and said sidewall have a thickness of less than about 0.10 mm.

In a fifth aspect of the invention, a method of manufacturing a shielded electronic component is disclosed. In one embodiment, the method comprises: disposing a shield structure formed at least partly via a selective metal deposition process in proximity with and at least partially surrounding an electronic component; placing said electronic component and said shield structure in a mold; and encapsulating said electronic component and said shield structure so as to form a unitary assembly. In one variant, said electronic component comprises an integrated circuit, and said shield structure is electroformed and adapted to substantially mitigate noise in the range of 2-6 GHz.

In a sixth aspect of the invention, a method of making a partition or standoff feature for a shield component is disclosed. In one embodiment, the method comprises: providing a substrate (e.g., a mandrel or other component suitable for electroforming); and electroforming said partition or standoff using said substrate. In one variant, at least a portion of said partition or standoff comprises a substantially rounded cross-section. This substantially rounded cross-section provides additional strength so as to permit other features of said shield component to be thinner than they would otherwise be without said substantially rounded at least portion. Moreover, the substantially rounded cross-section facilitates removal of said at least portion from a mandrel.

In a seventh aspect of the invention, a method of increasing the productivity of a manufacturing process is disclosed. In one embodiment, the process is used to form an integrated circuit device shield, and the method comprises utilizing a selective metal deposition process (e.g., electroforming) to form one or more features on a substrate, said features selected from the group consisting of: (i) a partition dividing an interior volume of said device shield; (ii) a stand-off for said device shield; and (iii) a sidewall of said device shield. In one variant, said forming of one or more features using an electroforming process is accomplished over a prescribed period, and includes forming a plurality of devices during the prescribed period.

In an eighth aspect of the invention, an electronic shield component is disclosed, wherein in an exemplary embodiment, at least portions of the shield component are formed by the method comprising using a selective metal deposition process (e.g., electroforming) in order to achieve component planarity and/or at least one other feature not achievable with other forming processes for a given size device.

In a ninth aspect of the invention, an array of shield elements is disclosed. In one embodiment, the array is electroformed. In another embodiment, the array is formed at least in part including the use of a plated polymer (e.g., plastic). In yet another embodiment, the array is formed including the use of a metal.

BRIEF DESCRIPTION OF THE DRAWINGS

The features, objectives, and advantages of the invention will become more apparent from the detailed description set forth below when taken in conjunction with the drawings, wherein:

FIG. 8E is a perspective view of a further alternative embodiment of an integrated shield structure manufactured in accordance with the principles of the present invention.

FIG. 9 is a table illustrating shielding effectiveness numbers for various exemplary coatings placed on metallized plastic shields as a function of frequency.

DETAILED DESCRIPTION OF THE PREFERRED EMBODIMENT

Figure 1A:
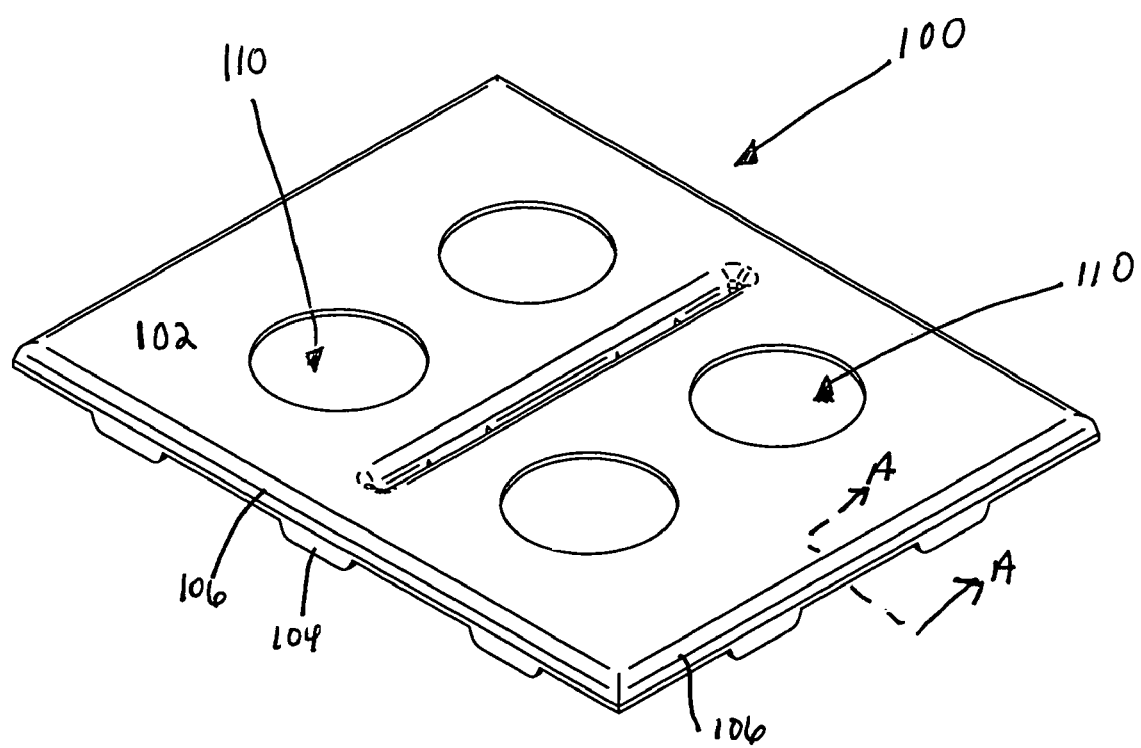
FIGS. 1A and 1B are top and bottom perspective views, respectively of a first embodiment of an integrated shield structure showing the various features thereof including electronic component mounting cavities.

Reference is now made to the drawings wherein like numerals refer to like parts throughout. It is noted that while portions of the following description are cast primarily in terms of shielding solutions for Multi-Chip Modules ("MCMs"), the present invention may be used in conjunction with any number of different electronic components (whether active or otherwise). Accordingly, the following discussion of the MCMs is merely exemplary of the broader concepts.

As used herein, the terms "electrical component" and "electronic component" are used interchangeably and refer to components adapted to provide some electrical or electronic function, including without limitation inductive reactors ("choke coils"), transformers, filters, gapped core toroids, inductors (coupled or otherwise), capacitors, resistors, operational amplifiers, and diodes, and integrated circuits, whether discrete components or in integrated form, whether alone or in combination.

As used herein, the term "signal conditioning" or "conditioning" shall be understood to include, but not be limited to, signal voltage transformation, blocking, filtering, current limiting, sampling, processing, and time delay.

As used herein, the term "integrated circuit (IC)" refers to without limitation any type of device, whether single or multiple die, having any level of integration (including without limitation ULSI, VLSI, and LSI) and irrespective of process or base materials (including, without limitation Si, SiGe, CMOS and GaAs). ICs may include, for example, memory devices (e.g., DRAM, SRAM, DDRAM, EEPROM/Flash, ROM), digital processors, SoC devices, FPGAs, ASICs, ADCs, DACs, radio frequency or other transceivers, memory controllers, and other devices, as well as any combinations thereof.

As used herein, the term "memory" includes any type of integrated circuit or other storage device adapted for storing digital data including, without limitation, ROM. PROM, EEPROM, DRAM, SDRAM, DDR/2 SDRAM, EDO/FPMS, RLDRAM, SRAM, "flash" memory (e.g., NAND/NOR), and PSRAM.

As used herein, the terms "microprocessor" and "digital processor" are meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components.

As used herein, the term "Multi-Chip Module" or "MCM" includes without limitation any type of integrated apparatus or device of any function which includes two or more electronic devices or integrated circuits that are subsequently combined, joined or related so as to form a substantially unitary electrical package.

As used herein, the term "wireless" means any wireless signal, data, communication, or other interface including without limitation WiFi, Bluetooth, 3G, HSDPA/HSUPA, TDMA, CDMA (e.g., IS-95A, WCDMA, etc.), FHSS, DSSS, GSM, PAN/802.15, WiMAX (802.16), 802.20, narrowband/FDMA, OFDM, PCS/DCS, analog cellular, CDPD, satellite systems, millimeter wave or microwave systems, acoustic, and infrared (i.e., IrDA).

Overview

In one salient aspect, the present invention discloses a shielding apparatus useful in the attenuation of electronic noise or spurious electric signals, such as for example those encountered within a wireless or computerized device. In one embodiment, the shielding apparatus is encapsulated with an electronic component such as an integrated circuit. At least parts of the apparatus are formed using a precise and selective metal deposition process such as electroforming that increases manufacturing efficiency and provides enhanced mechanical and structural features, as well as reduced cost. The exemplary deposition process allows for inter alia planarity and thickness values that are otherwise unachievable using prior art stamping or casting or molding processes. This in turn allows the shield component to very precisely correspond to the shape and size of the underlying electronic device (e.g., IC), thereby also minimizing space and footprint consumed by the shielded component. Cost efficiency is also enhanced using this approach.

Moreover, the approach described herein allows for rapid design and generation of customized shield configurations, including those accommodating heterogeneous chip package sizes, due to inter alia the flexibility of the exemplary deposition (e.g., electroforming) process used.

In another embodiment, the shielding apparatus comprises an array of multiple individual shields of the same or different design which can be simultaneously formed and processed, thereby further increasing manufacturing efficiency.

Multi-chip module (MCM) embodiments are also disclosed, wherein the shield of the invention can be applied to such modules while preserving all of the aforementioned attributes.

Methods of manufacturing and utilizing the shielding apparatus are also disclosed.

Exemplary Mechanical Configuration

Figure 1B:
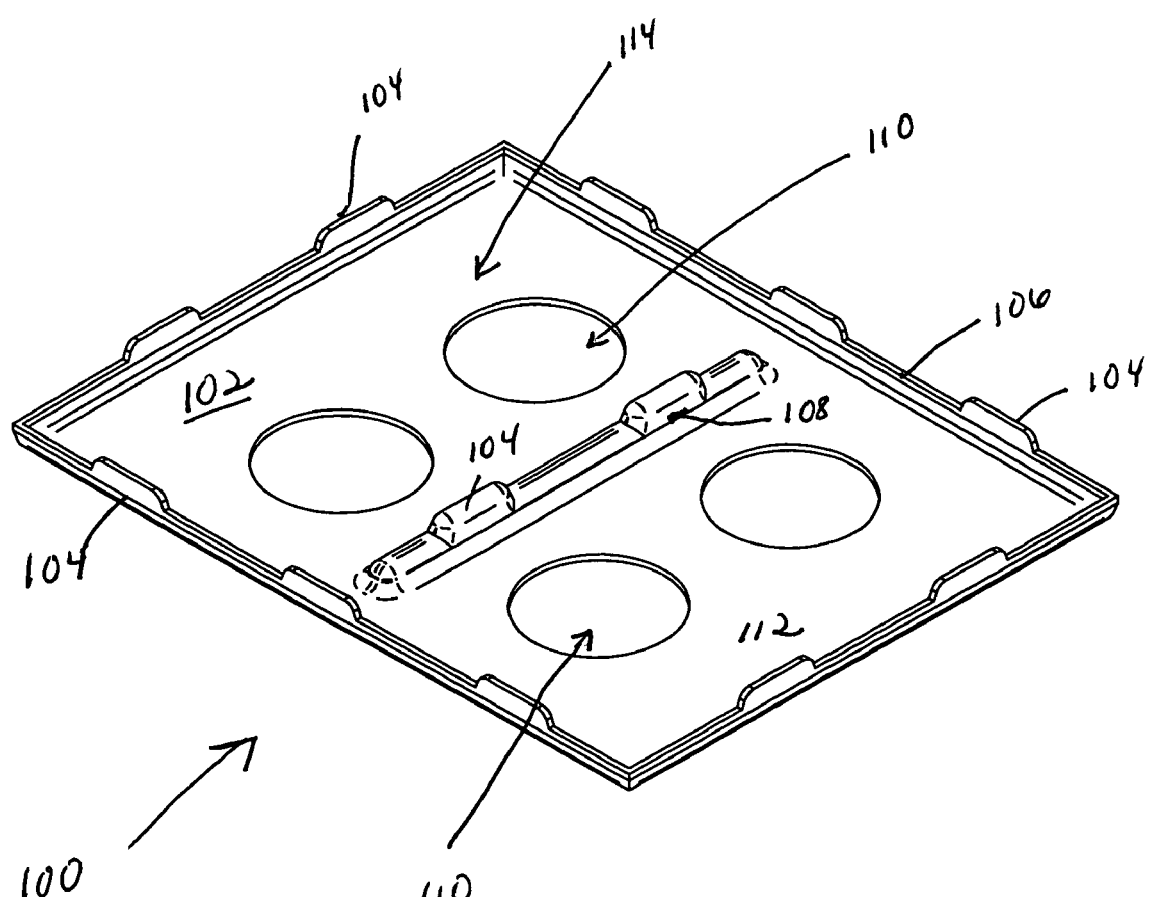

FIGS. 1A and 1B illustrate a first embodiment of an integrated shield structure 100 manufactured in accordance with the principles of the present invention. The integrated shield structure 100, in one or more embodiments, comprises an electroformed copper or nickel based alloy structure suitable for attenuating spurious electromagnetic or other noise or undesired signals. Specifically, in one embodiment, the integrated shield structure 100 is adapted to attenuate spurious electromagnetic noise in the 2-6 GHz frequency range, however various levels of attenuation and response as a function of frequency can be achieved via adaptation of various features of the integrated shield structure 100 of FIGS. 1A and 1B described herein, such adaptation being well within the skill of the ordinary artisan given the present disclosure.

The exemplary electroforming process comprises a process of precision metal part fabrication which uses electro-deposition in a plating bath over a precise base form or "mandrel" to which the subsequently formed or shaped part is then removed. In effect, the integrated shield structure 100 is synthesized by controlling the electro-deposition of metal passing through an electrolytic solution onto the mandrel form. The process is essentially very similar to electroplating well known in the electronic arts, however the process differs from electroplating in that the skin of electroplated material is much thicker and can exist as a self-supporting structure once the mandrel is removed.

The electroforming process has many advantages when utilized in applications such as integrated shielding in electronic components, as the electroforming process is capable of reproducing the form of the mandrel without the shrinkage and distortion associated with other metal forming techniques such as casting, stamping or drawing. Further, the shape possibilities for the shield structure are virtually unlimited as complex curves, cavity dividers, legs or stanchions, standoff locations, or other structures can be readily incorporated without the limitations associated with stamping and/or other common manufacturing processes.

Electroforming also has distinct advantages over metal stamping processes in that there are no resultant seams in the formed part (e.g., shield) which improve its strength and attenuation performance. Further, coplanarity of the structure 100 is excellent when using the electroforming process, and such coplanarity can be maintained well within the industry standard (e.g., 0.004 in.) associated with standard mounting processes since warpage and distortion are virtually non-existent in electroformed parts.

Stampings also tend to have limits associated with them in terms of wall height, thickness, etc. There are also issues presented with stampings relating to bend radius limitations (e.g., for forming sidewalls). Electroforming accordingly provides added flexibility when designing structures to minimize the amount of space consumed in the ultimate shielding application. Further, the tooling associated with electroforming processes is often comparatively simple (as compared with e.g., a prior art progressive die approach), thereby permitting prototyping of new shield structure designs in a matter of days or weeks as compared with progressive stamping tooling which often can take on the order of months to prepare.

In addition, since the mandrel used in electroforming is often machined or otherwise formed as an outside surface (or inside inserts), close dimensional tolerances and high surface finishes can be held (via electrical discharge machining or "EDM" and the like) and maintained on complex interior configurations. The electroforming process allows high-quality duplication of the master, and therefore permits very high quality and tolerance production, at relatively low unit costs with excellent part-to-part repeatability.

Casting or molding techniques characteristically have difficulty making long thin sections flat (planar), and hence necessarily produce a thicker (less spatially efficient) and less effective shield.

It will be recognized however that while electroforming comprises an excellent choice, other manufacturing processes such as casting, forming and the like may readily be used consistent with the present invention, such as where the attributes of electroforming are not required. The electroforming process is exemplary in applications where, for example, the complexity of the shape, the high precision required and/or, the relatively small size of the manufactured component are necessary requirements unachievable with other technologies. However all such alternative build processes are contemplated by the present invention.

Figure 1C:
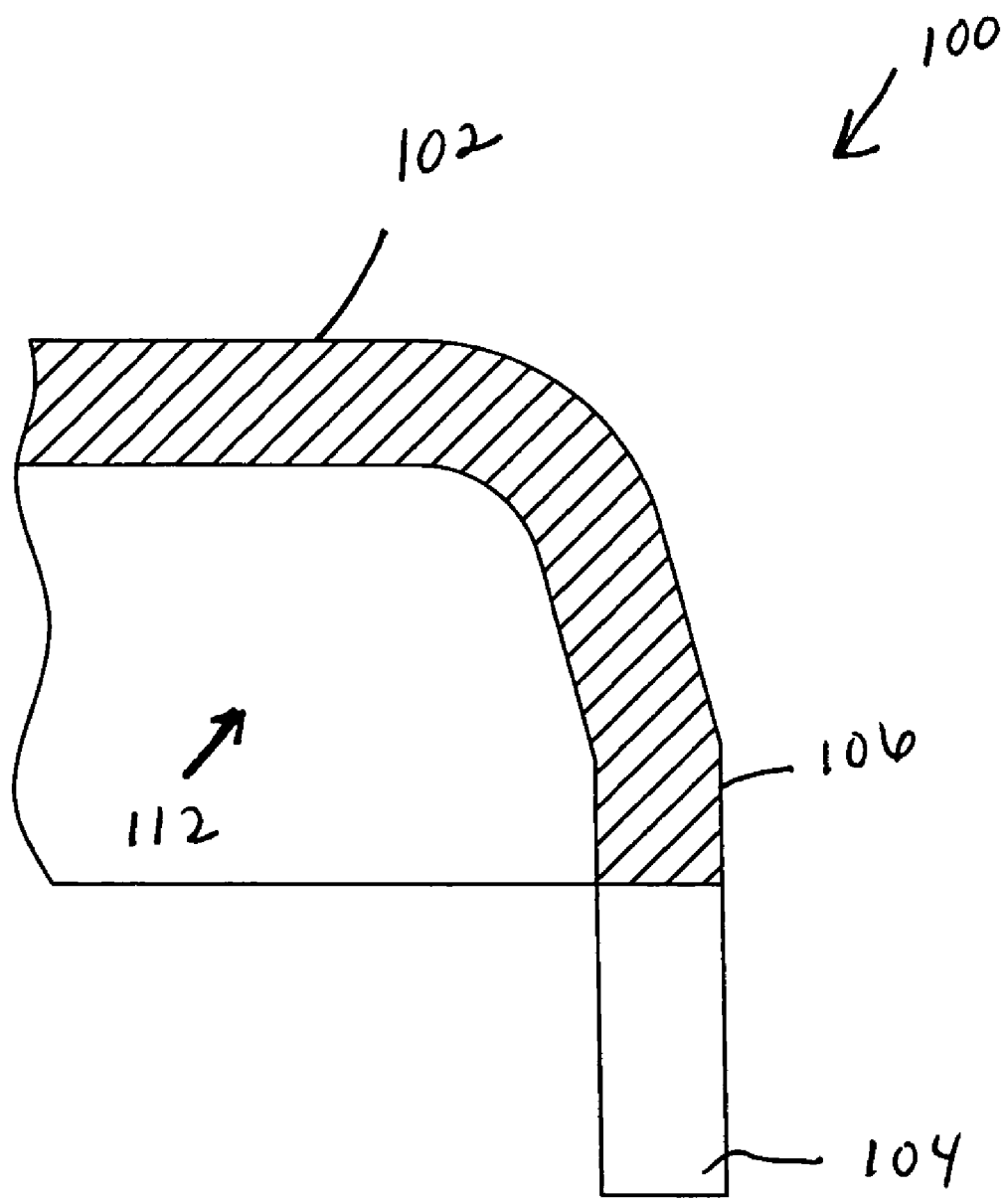
FIG. 1C is a sectional view along A-A of the first embodiment of the integrated shield structure of FIG. 1A.

In an alternative embodiment, the integrated shield structure 100 of FIG. 1 may be manufactured using chemical subtraction process or electrochemical etching (i.e. utilizing photo-lithography, chemical milling, etc.) processes well known in the art. Chemical etching processes typically have advantages in terms of prototype cost and lead times as the tooling charges associated with the process (e.g. photo-resist masks or templates) tend to be minimal. The resultant etched shield structure 100 may then subsequently be plated using standard methods. For example, in one variant, the shield or other component is electroformed, and then features or parts are etched therein (or vice-versa).

In the case of photo-resists, it will be appreciated that either a positive resist or negative resist (or combinations thereof, e.g., as part of different process steps) may be utilized consistent with the invention. As is well known, positive and negative resists are effectively mirror images of one another, and allow either for the removal of all resist surrounding the exposed portions of the resist, or only the exposed portions, respectively. These capabilities can be used to, e.g., build separator structures (walls dividing the different cavities of the shield 100 as described subsequently herein), legs, sidewalls, or for any number of other purposes.

In yet another embodiment, the shield structure 100 may be formed using a multi-component approach, such as via electroforming the shield over a polymer or even another metal disposed over the mandrel. In one variant, a layer of plastic is formed over the mandrel (such as via deposition, molding, or other suitable process). Alternatively, the plastic component may be pre-molded and then placed over the mandrel. Next, at least a portion of the plastic is used as the basis for electroforming or "metallizing". Once the electroform process is complete, the mandrel may be removed, leaving the metallized plastic. Similarly, the plastic may be replaced with other materials, such as e.g., metals, or even composites. In one variant, the metal is chosen to be dissimilar (i.e., not the same as the electroformed metal layer). In another variant, the metals are selected to be substantially identical. See also the methods and apparatus disclosed in U.S. Pat. No. 6,294,729 to Kaplo issued Sep. 25, 2001 and entitled "Clad polymer EMI shield", which is incorporated by reference herein in its entirety, which may be used consistent with the invention.

It will be appreciated that literally any removable selective metallization/deposition process (i.e., a process wherein metal is built up or deposited on selective regions of a mandrel or other such structure, from which it may then be removed) may be used to form all or parts of the shield element(s) described herein. For example, in addition to electroforming described previously herein, other such processes may include without limitation chemical vapor deposition (CVD), vacuum metallization, vacuum deposition, etc., which are well known in the processing arts. These processes each advantageously allow precise control of metallization layer thickness and selective deposition (e.g., are amenable to use of masking techniques). Still other approaches and configuration can be used consistent with the present invention; see e.g., U.S. Pat. No. 6,768,654 to Arnold, et al. issued Jul. 27, 2004 and entitled "Multi-layered structures and methods for manufacturing the multi-layered structures", U.S. Pat. No. 6,833,031 to Arnold issued Dec. 21, 2004 entitled "Method and device for coating a substrate", U.S. Pat. No. 6,909,615 to Arnold, et al. issued Jun. 21, 2005 entitled "Equipment and methods for producing continuous metallized thermoformable EMI shielding material", U.S. Pat. No. 7,109,410 to Arnold, et al. issued Sep. 19, 2006 entitled "EMI shielding for electronic component packaging", and U.S. Pat. No. 7,129,422 to Arnold issued Oct. 31, 2006 entitled "EMI absorbing shielding for a printed circuit board", each of the foregoing being incorporated herein by reference in its entirety.

Other packaging methods such as those disclosed in co-owned U.S. Pat. No. 5,706,952 entitled "Continuous carrier for electrical or mechanical components"; co-owned U.S. Pat. No. 5,938,996 entitled "Method for making a continuous carrier for electrical or mechanical components"; and co-owned U.S. Pat. No. 6,202,853 entitled "Secondary processing for electrical or mechanical components molded to continuous carrier supports", the contents of each of which are incorporated by reference herein in their entirety, may advantageously be utilized in conjunction with the integrated shield structures or shield structure arrays of the present invention.

Figure 9A:
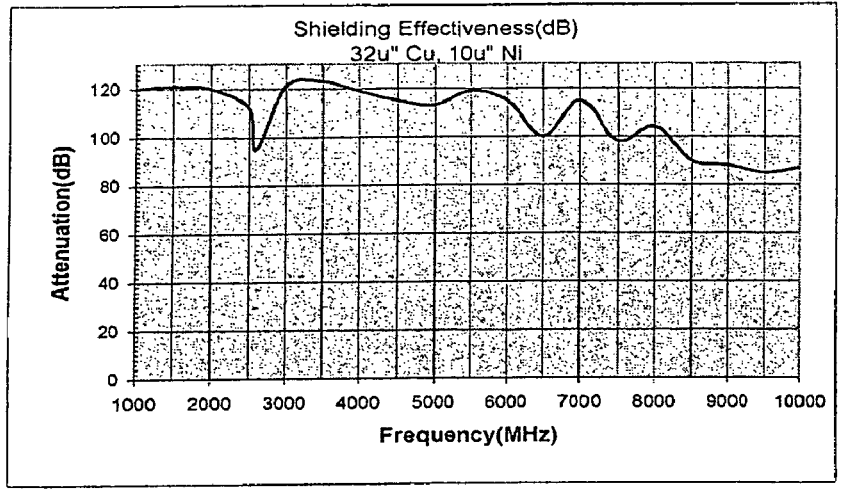
FIG. 9A is a graphical illustration of the shielding effectiveness of a first embodiment of copper over nickel plating as a function of frequency.
Figure 9B:
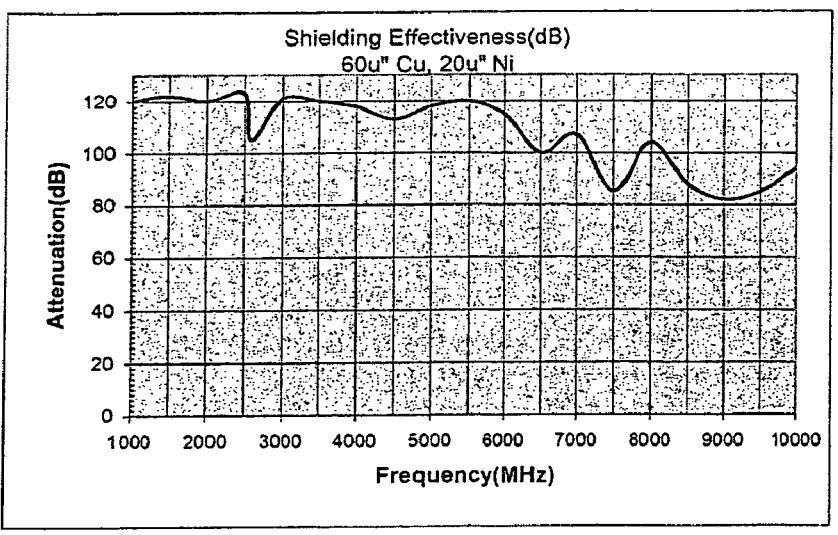
FIG. 9B is a graphical illustration of the shielding effectiveness of a second embodiment of copper over nickel plating as a function of frequency.

FIG. 9 illustrates various shielding effectiveness numbers as a function of frequency for a plurality of exemplary metallized plastics. The table of FIG. 9 shows the various attenuation performances that can be expected using a variety of metallized coatings. FIGS. 9A and 9B offer further detail with regards to specific plating compositions and their attenuation performance between 1-10 GHz. It will be appreciated that these performance values are merely exemplary, and representative of only certain embodiments disclosed herein.

Referring again to FIG. 1A, the integrated shield structure 100 comprises several noteworthy features. Firstly, the thickness of the top wall structure 102 and side wall structures 106 can be made quite thin, while at the same time remaining a self-supporting structure. In one embodiment, the thickness of the wall structure is made to have a thickness of approximately 0.05 mm (roughly 0.002 in). In another embodiment, the wall thicknesses can vary such that, for example, the top wall 102 can have a wall thickness of about 0.13 mm (about 0.005 in.), while the side walls 106 have a different thickness. Hence, the present invention contemplates not only inter-wall thickness differences, but also intra-wall thickness variations (i.e., variations of thickness within a single wall or surface).

Moreover, the present invention also contemplates the use of a top wall in conjunction with a plurality of posts or standoffs, which may partly or even completely obviate the use of a side wall.

The exemplary integrated shield structure 100 of FIG. 1A may further comprise a plurality (e.g., two) of cavities 112, 114 separated by a complete or partial dividing wall 108. Legs (support structures) or other structures can also be included in place of or in addition to the aforementioned sidewalls or dividing wall(s). The dividing wall 108 is useful for, inter alia, shielding electronic components resident in cavities 112 and 114, respectively, from one another, and/or providing differential amounts of shielding to the different devices. On this latter point, for example, one may desires that a certain IC have a first level of shielding, while that immediately adjacent to it on the PCB have another level of shielding, both ICs being subsumed within the same shield element 100.

In addition, dividing wall 108 adds supporting structure for the integrated shield structure 100, thereby permitting thinner top and/or side wall thicknesses.

The exemplary integrated shield structure 100 also further optionally comprises features that facilitate application of the structure such that it is encapsulated with the electronic component(s) that it is intended to shield. Specifically, fill apertures or cavities 110 and standoffs 104 provide structure which facilitates the encapsulation process, more fully described below. The size and number of the fill apertures 110 and standoffs 104 may be varied in order to balance or otherwise control the flow of encapsulant (or a comparable substance) in later optional processes while also providing the requisite degree of electromagnetic noise attenuation. As can be expected, the larger the fill aperture 110 and standoff 104, the easier it will be to flow encapsulating compounds (such as epoxy or silicone compounds) of a given viscosity around the shield structure 100 and the electronic component. However, very large apertures 110 and standoffs 104 may also conceivably degrade noise attenuation characteristics, depending on inter alia the wavelength λ of the EMR to be attenuated, etc. Therefore, the size, placement, and/or number of cavities 110 and standoffs 104, along with the encapsulant properties, should be considered so as to achieve encapsulant filling goals while maintaining suitable noise suppression/attenuation performance.

The fill apertures also function to allow air and gas to escape during filling, thereby advantageously reducing voids or cavities within the filled device.

It will also be appreciated that while substantially circular fill apertures or cavities 110 are shown, other shapes may be used with equal success, including without limitation squares, hexagons, octagons, ellipses, non-symmetric shapes, and so forth.

The overall height of the exemplary integrated shield structure 100 is also advantageously very low in profile. For example, in the embodiment shown in FIG. 1A, the overall height of the structure 100 including its standoffs 104 is about 0.55 mm (about 0.02 in.) in height, although other embodiments with lower heights (e.g., 0.40 mm or 0.010 in.) are possible. In fact, a wide variety of geometries and sizes are envisioned consistent with the invention, including e.g., 4×6, 3×3, 4×4, 5×5, 6×6, 7×7, 8×8, 9×9, 10×10, among others. The possibilities and different configurations are literally boundless. It will also be appreciated that any size and units of scale can be employed within plating or forming capabilities; e.g., 4 mm×6 mm, 40 mm×60 mm, etc., the foregoing being merely exemplary.

In one variant, a Nickel or Nickel alloy is utilized to form the shield. In another variant, a plurality of layers of the shield structure are formed using different metals. It will also be appreciated that use of a magnetic material will afford the ability to remove the electroformed shield from the mandrel using a magnet. For example, in one embodiment, the magnet's shape is adapted to substantially conform to the general shape and/or size of the shield to be removed from the mandrel.

Another salient feature of the electroformed integrated shield structure of FIG. 1A is its inherent resistance to high temperatures (e.g. 260° C.) encountered in solder reflow operations ubiquitous in the electronics industry. This high-temperature capability allows a wide range of other processes such as reflow to be conducted with no deleterious effects on the shield 100, such as warpage or loss of strength. Moreover, the underlying base material of the structure 100 can further be electroplated to improve e.g. EMI shielding effectiveness, conductivity, solder ability, etc.

As can also be seen in FIGS. 1A and 1B, the edges of the standoffs 104 of the shield 100 advantageously comprise rounded edges, thereby facilitating their removal from the mandrel during the exemplary electroforming process. The mandrel can either be a reusable mandrel, or alternatively may comprise a mandrel that is subsequently discarded. For example, the non-reusable mandrel could be chemically removed from the electroformed product if desired. In another embodiment, a flat profile is used, thereby simplifying masking.

Referring now to FIG. 1B, a cross sectional view at A-A of the exemplary shield structure of FIG. 1A is shown and described in detail. Of particular note in this embodiment is the difference in thickness and shape between the top wall 102 and side wall 106. This relative difference in thickness adds structural strength to the shield 100, while at the same time maximizing the available space in the cavity 112. Also of note is the draft angle or taper associated with side walls 106; this facilitate the release of the shield structure 100 from the mandrel upon which it is electroformed. It will be appreciated, however, that straight walls can also be used consistent with the invention if desired.

It will be appreciated that for those embodiments where multiple shield electroform thicknesses are used (e.g., top wall of a different thickness than the side walls, different regions of the top wall having different thicknesses, etc.), a formation process comprising multiple electroforming and/or masking steps may be utilized to achieve this result. For instance, in one variant, different portions of the shield are formed by immersing the different portions within an electroforming bath, and/or for different time periods. In another variant, a prescribed thickness of material is electroformed, removed from the bath, selectively masked or inhibited, and then the unmasked portions "grown" to the desired (greater) thickness. Various other approached will be recognized by those of ordinary skill given the present disclosure.

Figure 2:
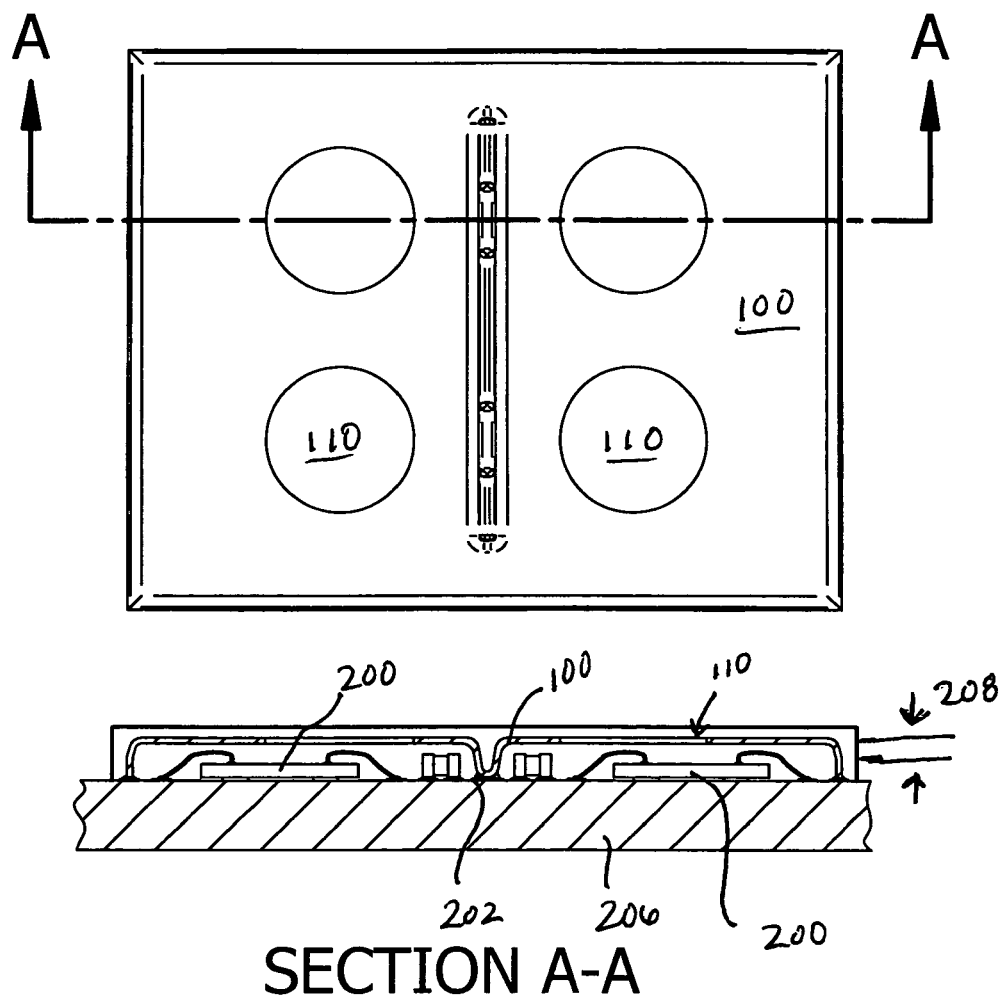
FIG. 2 is a sectional view illustrating the integrated shield structure of FIG. 1 after being encapsulated in conjunction with an electronic component.

Referring now to FIG. 2, a cross section view of the shield structure 100 is illustrated after the electronic component 200 it shields has been encapsulated using an epoxy compound 202. As can be seen in FIG. 2, both the electronic component 200 and shield structure 100 are secured to a substrate 206. The substrate 206 may comprise any number of well known materials, with ceramic being exemplary in applications such as MCM shielding, etc. These components 100, 200 are, in one embodiment, secured to the substrate 206 using a conductive adhesive or epoxy. In another embodiment, the electronic component 200 and shield 100 are secured using a solder ubiquitous in the electronic arts. The clearance 208 between the electronic component 200 and the shield structure 100 facilitates the flow of epoxy through the holes 110 and the standoff gap 104. After encapsulation, the integrated shield 100 has become embedded with the electronic component 200, thereby forming a unitary electronic component assembly with integrated shielding.

Referring now to FIGS. 3A-3I, various projection views are shown with accompanying detail and sectional views, thereby illustrating the various design features of an alternative embodiment of another integrated shield structure 300 embodiment.

Figure 3:
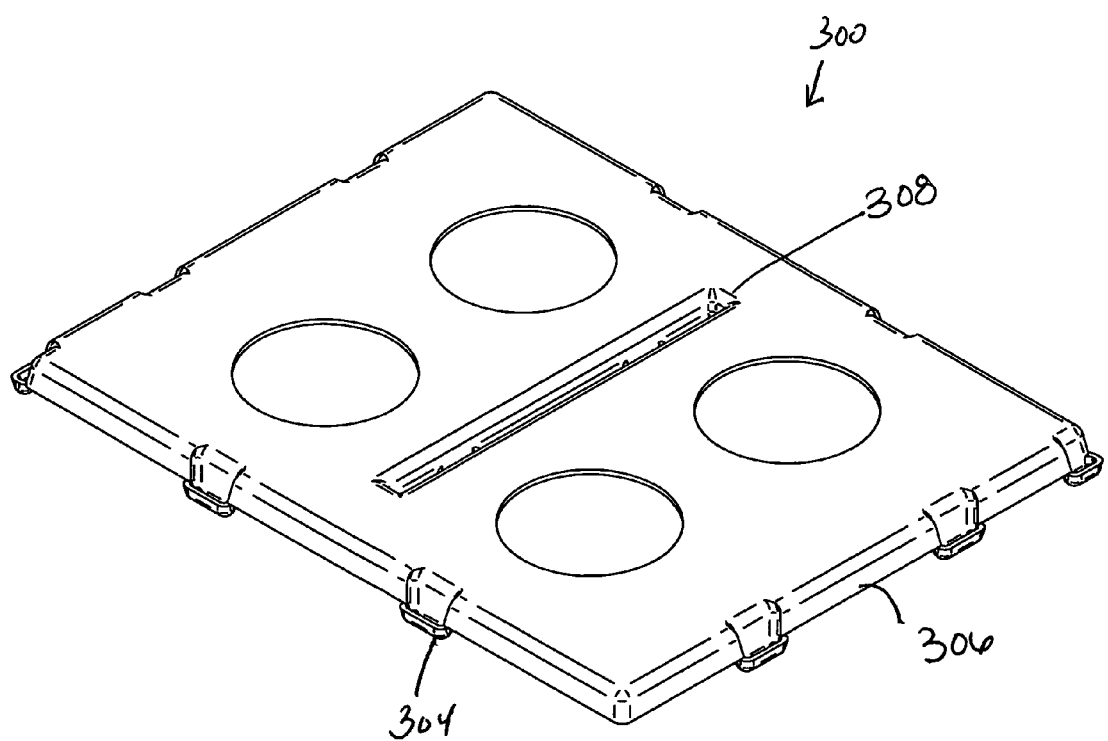
FIG. 3 is a perspective view of a second embodiment of an integrated shield structure.
Figure 3A:
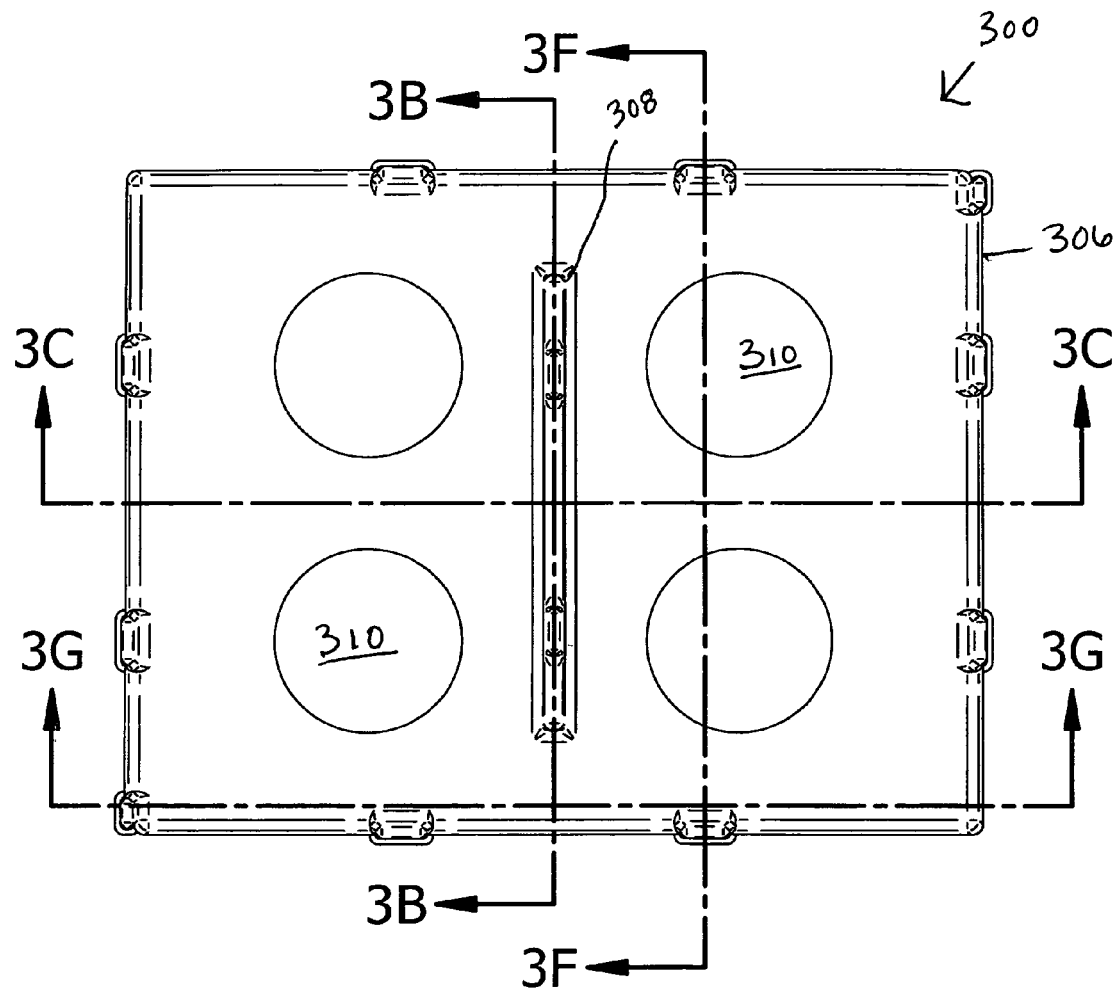
FIG. 3A is a top view of the integrated shield structure of FIG. 3.

FIGS. 3 and 3A illustrate several notable features of the shield structure 300 including side walls 306, fill cavities 310 and divider cavity wall 308. These features function similarly to those features discussed above with respect to FIGS. 1A-1B.

Figure 3B:
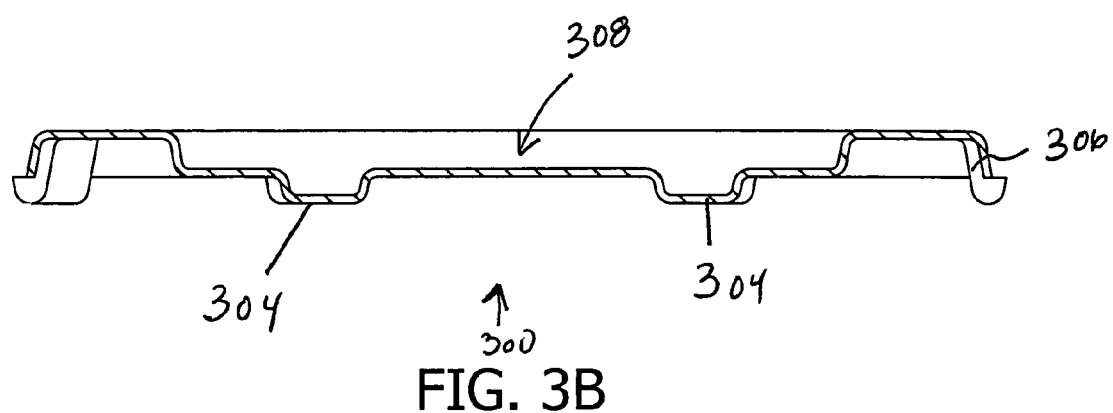
FIG. 3B is a sectional view taken along B-B of the integrated shield structure shown in FIG. 3A.

FIG. 3B illustrates standoff features 304 utilized in conjunction with divider cavity wall 308.

Figure 3C:
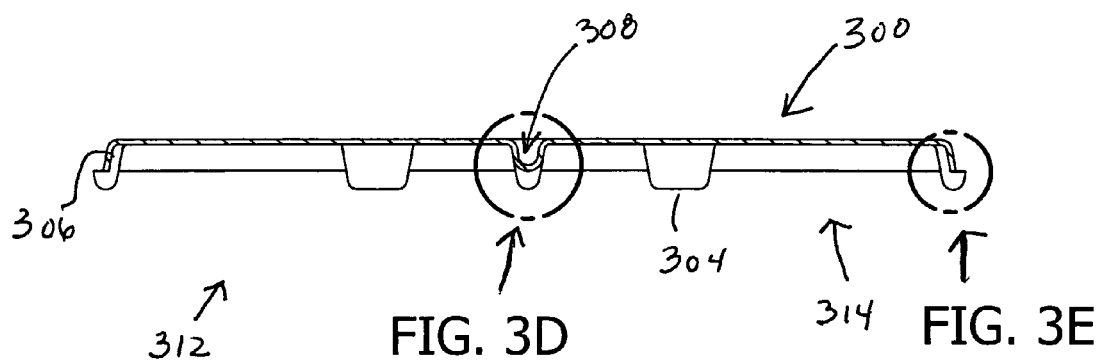
FIG. 3C is a sectional view taken along C-C of the integrated shield structure shown in FIG. 3A.

FIG. 3C illustrates first 312 and second 314 cavities divided by divider wall 308.

Figure 3D:
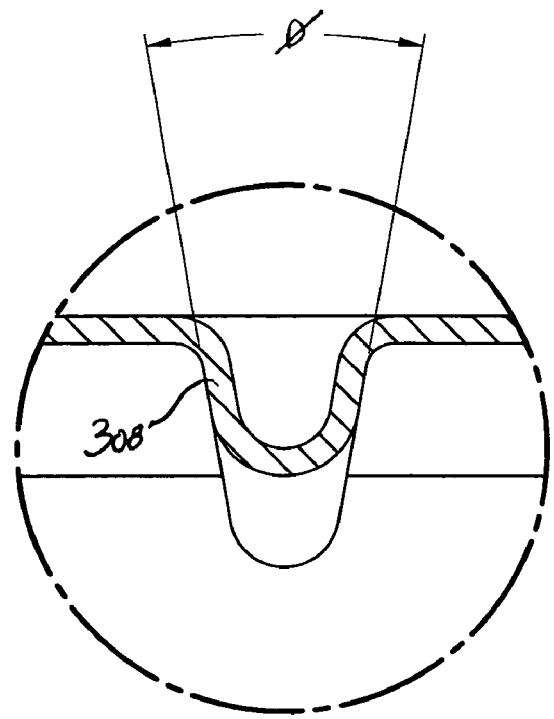
FIG. 3D is a detail view of a feature illustrated in FIG. 3C.

FIG. 3D is a detail view of the cavity divider wall 308 of the integrated shield structure 300.

Figure 3E:
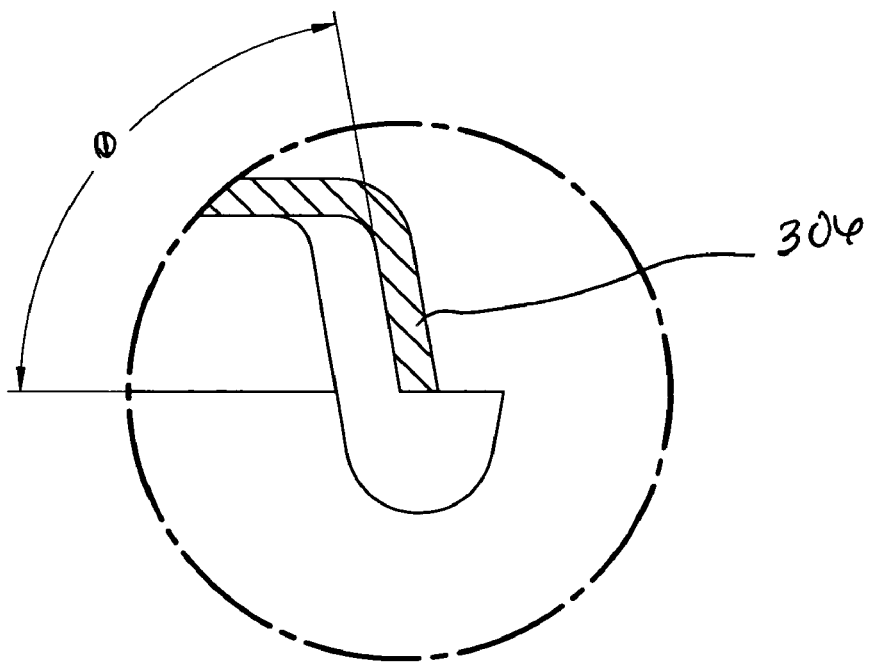
FIG. 3E is a detail view of a feature illustrated in FIG. 3C.
Figures 3F, 3I:
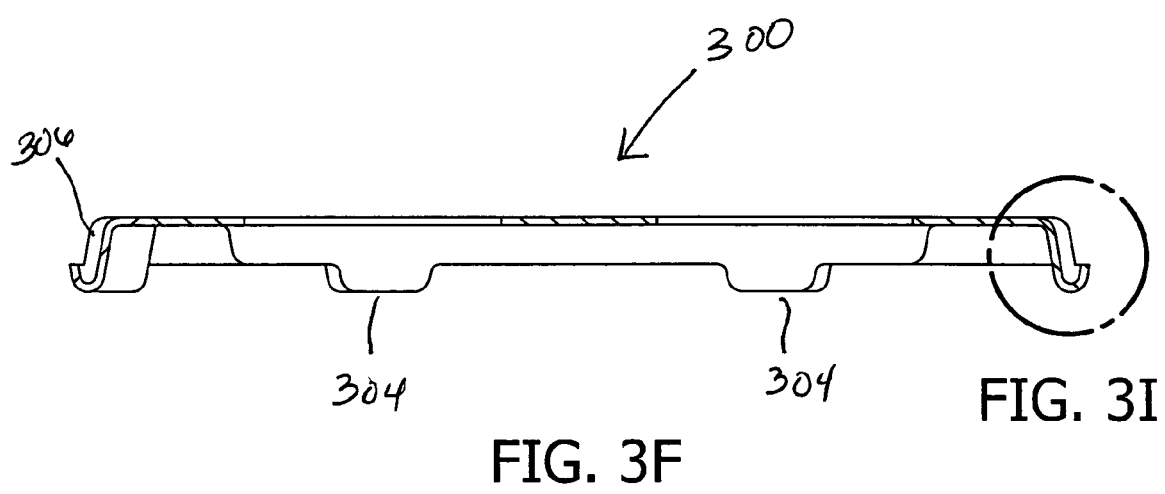
FIG. 3F is a sectional view taken along E-E of the integrated shield structure shown in FIG. 3A.
FIG. 3I is a detail view of a feature illustrated in FIG. 3F.
Figures 3G, 3H:
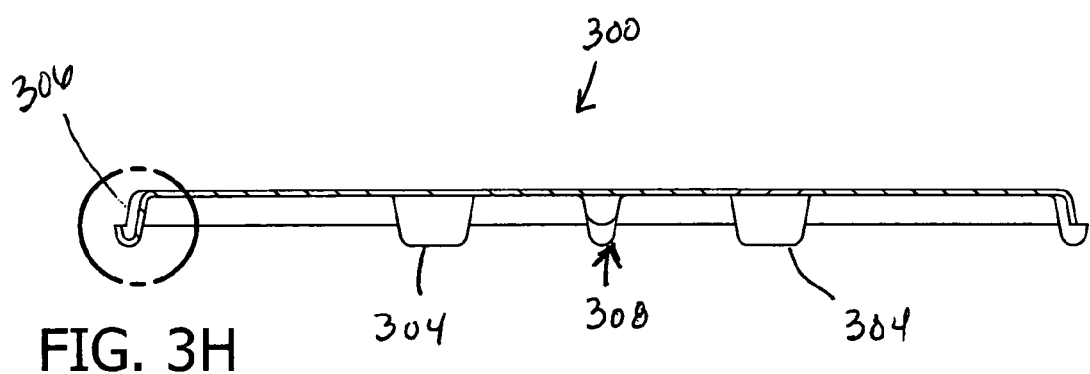
FIG. 3G is a sectional view taken along F-F of the integrated shield structure shown in FIG. 3A.
FIG. 3H is a detail view of a feature illustrated in FIG. 3G.
Figure 3H:
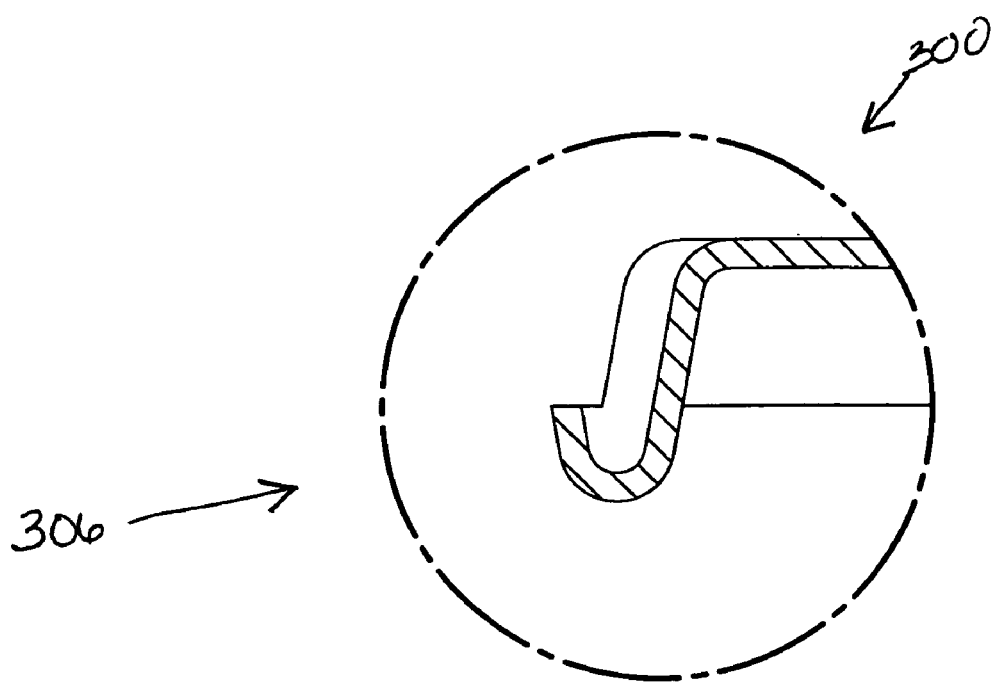
Figure 3I:
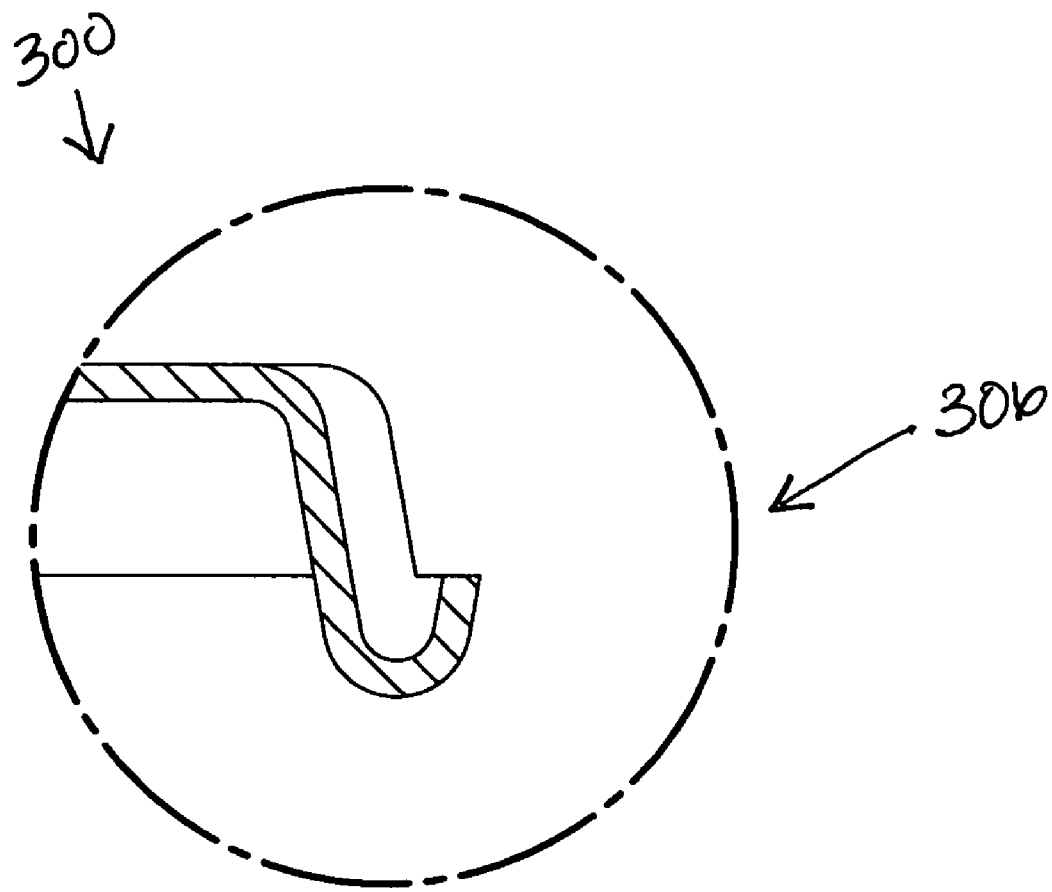

FIGS. 3E, 3H and 3I are detailed views of the side wall 306 of the integrated shield structure 300.

The standoffs or divider may also be formed so as to have a substantially "V" or "U" shaped profile if desired. This may be a solid shape, or alternatively a "hollow" or formed shape. In one variant, the divider comprises a "wrinkle" or undulation formed into the shield element at time of electroforming. In another variant, the divider is formed after electroforming, such as via a deformation process.

Figure 4:
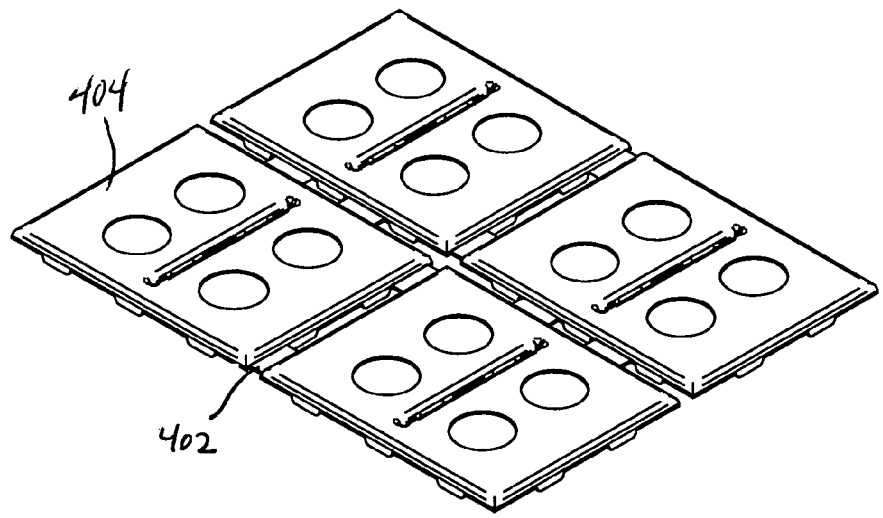
FIG. 4 is a perspective view of a first embodiment of an integrated shield array structure having multiple shields.

Referring now to FIG. 4, an array 400 of shield structures 404 are shown and described in detail. As used herein, the term "array" refers broadly to any aggregation of shields which may or may not be the same, and may or may not be coupled or in communication with one another, and is not in any way limited to a traditional "row and column" array configuration. In the embodiment shown, the array 400 comprises a 2×2 array with shield elements 404 that are linked via linkage structures 402. These linkage structures effectively join or combine each integrated shield structure 404 with an adjacent shield structure, thereby providing certain advantages. Specifically, the array 400 of FIG. 4 offers advantages in terms of high volume production such as: (1) lower product cost; (2) lower packaging cost; (3) lower per unit tooling cost; while at the same time (4) providing an opportunity to mass encapsulate (and/or separate) a plurality of electronic components. It is appreciated that while a 2×2 array 400 is shown in FIG. 4, any number of other variations are possible (e.g. 1×3, 2×3, 3×3, etc., as well as non-row/column approaches as previously described).

In another embodiment, the individual shields are formed separate from one another (e.g., without linkages). This may be accomplished using a common mandrel, or alternatively two or more mandrels. Other approaches may also be used.

In yet another embodiment, two or more of the individual shields are in some respect different or heterogeneous from at least one other shield. For example, in one variant, the electroformed thickness of two different shields might vary, or their shape or size (or number of electronic device enclosures) varied.

Note also that the linkage elements or structures 402 (where used) may also be heterogeneous (i.e., different shape, size, type, etc.) if desired.

The array 400 of FIG. 4 also has advantages in applications where the integrated shield structures 402 are utilized in an MCM application. MCM's are typically manufactured as an array, over-molded with an encapsulant, and then subsequently diced apart with a saw or other such apparatus. Hence, the integrated shield array 400 as shown in FIG. 4 could advantageously be utilized in a process that is virtually identical to existing MCM manufacturing processes.

Figure 4A:
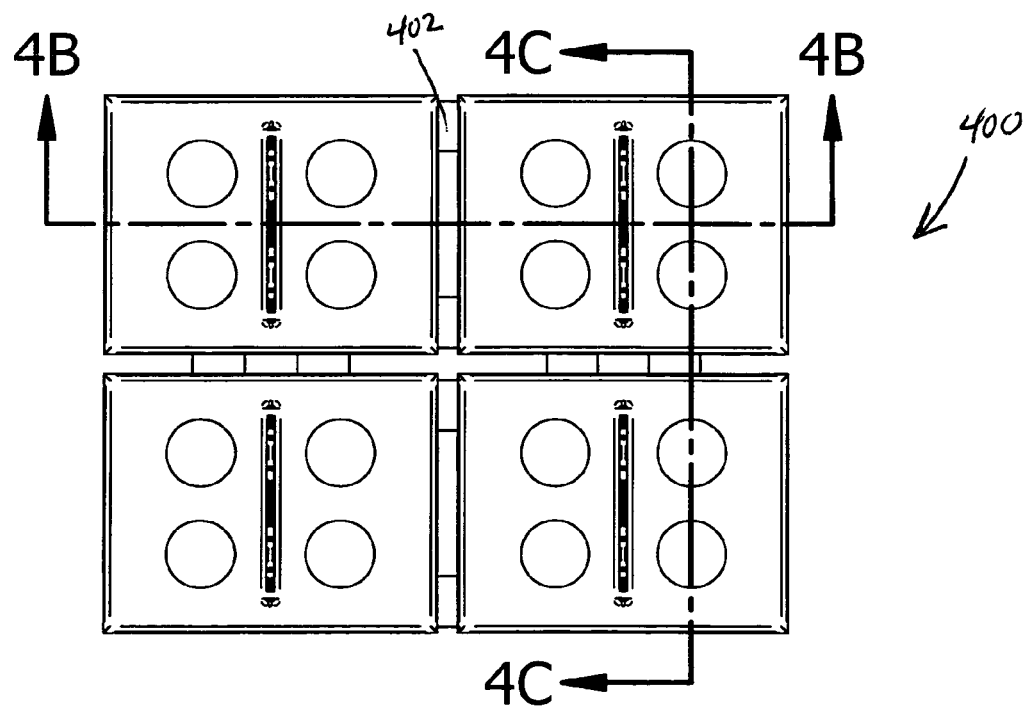
FIG. 4A is a top view of the exemplary integrated shield array structure of FIG. 4.
Figure 4B:
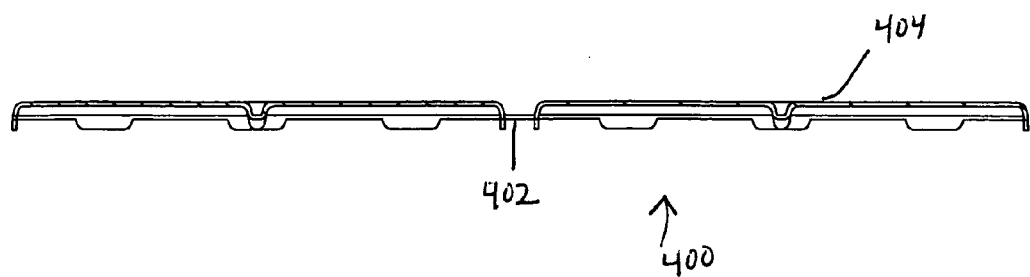
FIG. 4B is a sectional view taken along B-B of the integrated shield array structure shown in FIG. 4A.
Figure 4C:
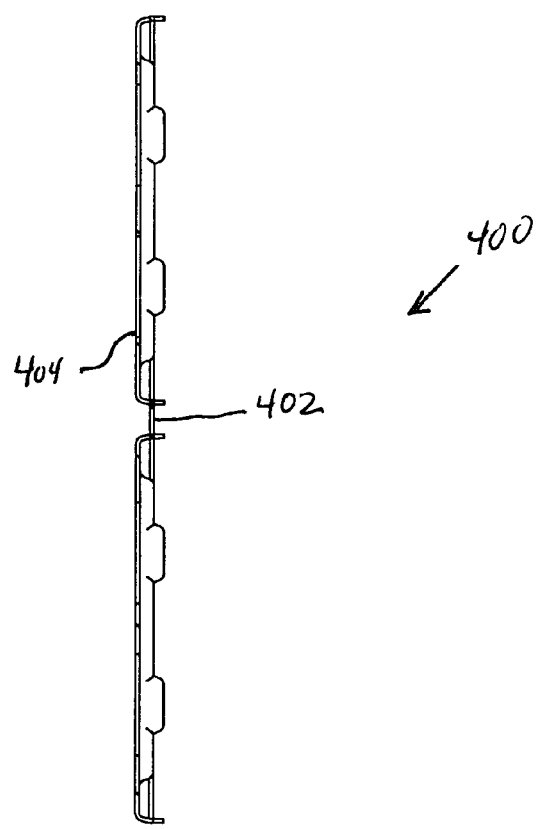
FIG. 4C is a sectional view taken along C-C of the integrated shield array structure shown in FIG. 4A.

Referring now to FIGS. 4A-4C, various projection views are shown with accompanying sectional views, thereby illustrating the various features of the exemplary embodiment of the shield array structure 400 of FIG. 4.

Figure 5:
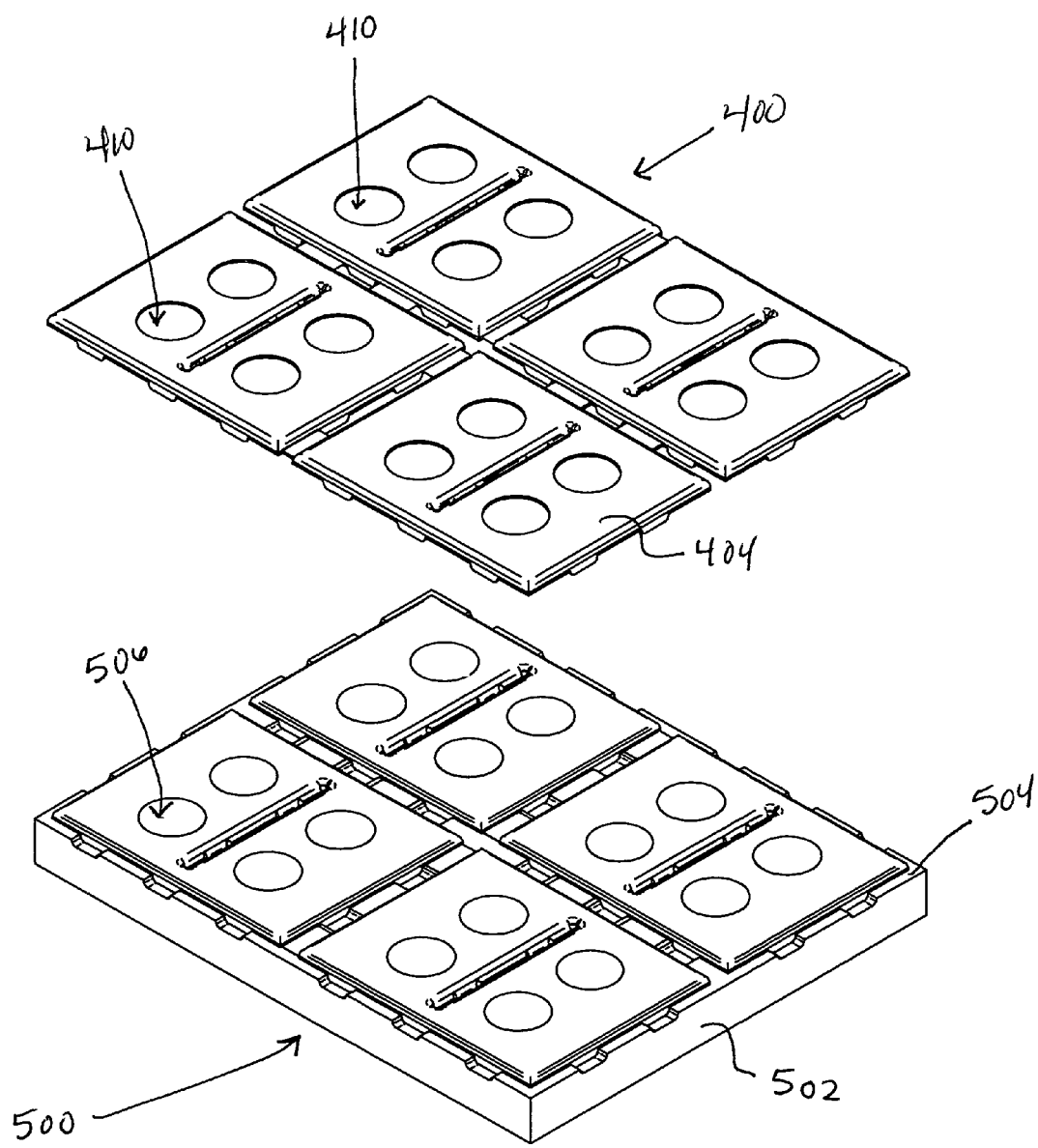
FIG. 5 is a perspective view of the mandrel used to electroform one embodiment of the integrated shield array structure of FIG. 4, along with electroformed shields being removed therefrom.

Referring now to FIG. 5, one embodiment of the mandrel 500 utilized to manufacture the integrated shield array structure 400 is shown and described in detail. The mandrel 500 itself comprises a metallic base 502 (such as stainless steel, aluminum or an alloy) with a non-electrically conductive mask 504 placed thereon. Polymer or other inserts 506, such as those formed from e.g., a thermoplastic or epoxy, comprise non-conductive structures within the mandrel 500 and are utilized to form the fill features 410 of the shield array structure 400. These inserts may be part of the mask, or alternatively used as separable components.

Figure 6:
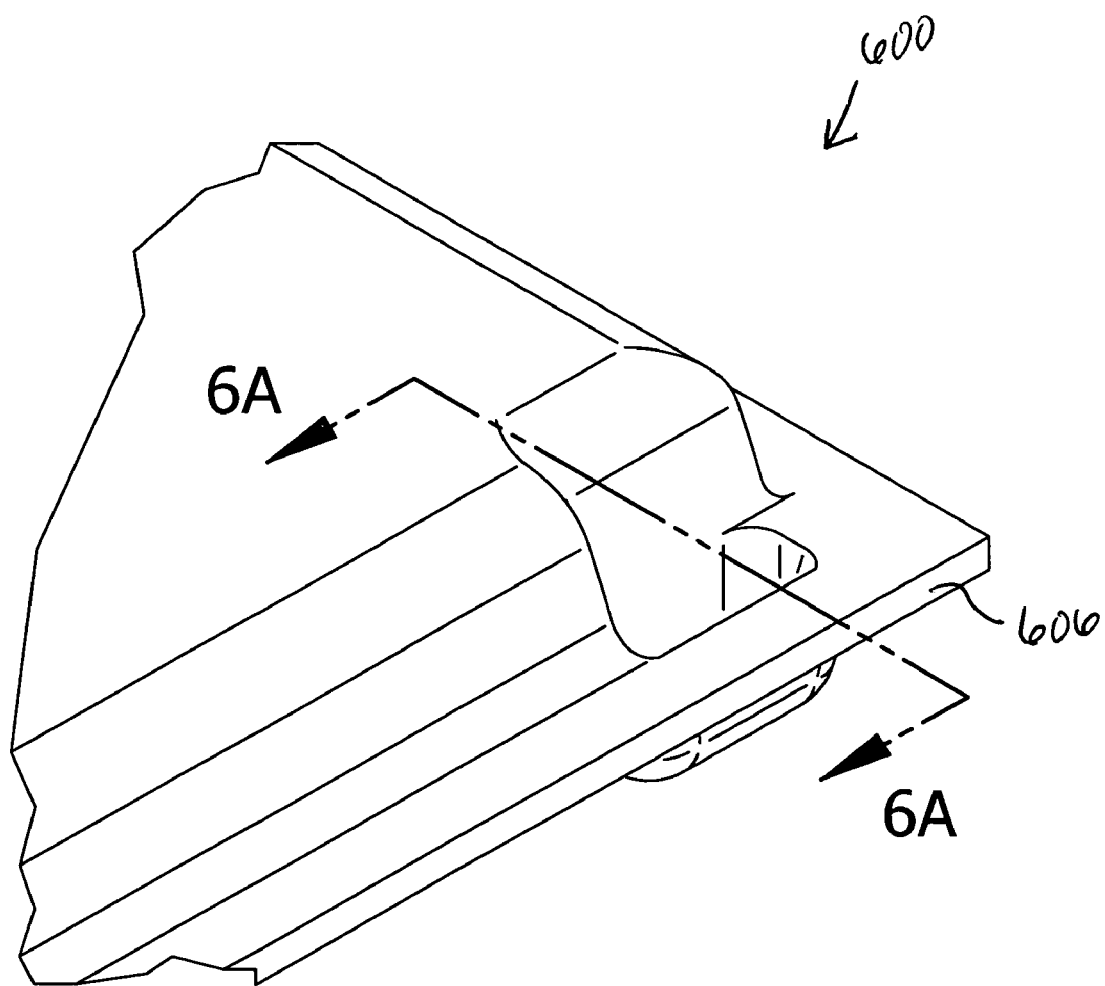
FIG. 6 is a perspective view of an alternative design for the edge of an integrated shield structure.
Figure 6A:
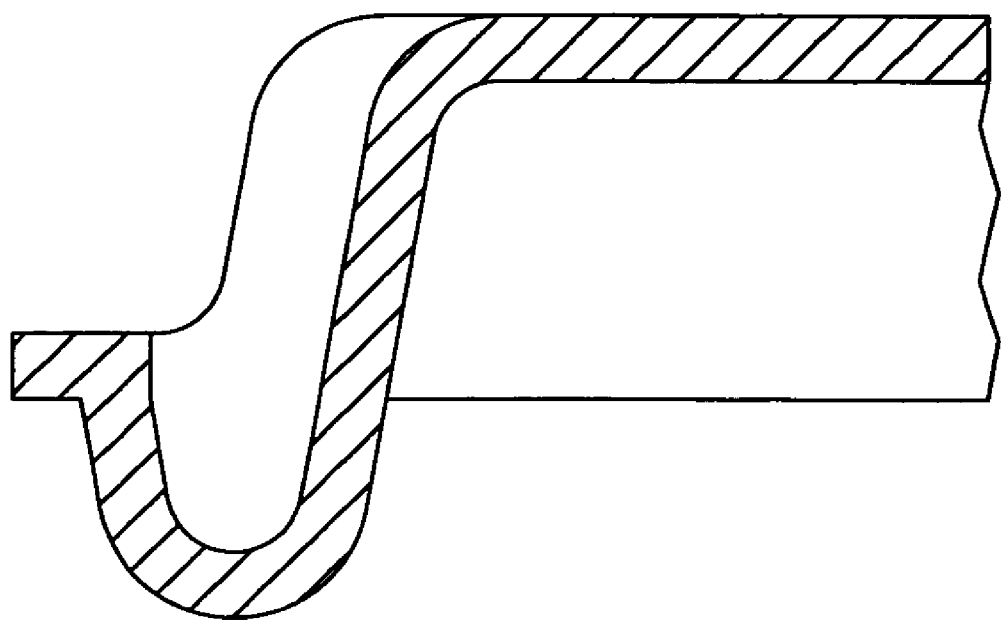
FIG. 6A is a sectional view of the integrated shield structure of FIG. 6 taken along section B-B.

Referring now to FIG. 6, one exemplary alternate design for a lip 606 of a shield structure 600 according to the invention is shown and described in detail. The lip 606 of shield structure 600 is formed so that contact point P (see FIG. 6A) is offset from the lip 606 and sidewalls 106. This allows the lip 606 to have a substantially "sharp" edge, and moreover allows for a buffer area between the plating and the masking technologies. Hence the offset aligned sidewall 106 with contact point P and lip 606 provide a standoff for masking processes, which makes use of these processes much easier.

The embodiment shown in FIG. 6 also comprises a substantially "tub" shaped (e.g., bathtub-shaped) structure, which advantageously provides significant structural strength by virtue of its dimensionality. Specifically, a thin-walled but non-dimensional structure (i.e., a shape comprising a substantially flat plane or the like) would afford little in the way of structural integrity or strength since inter alia it would buckle or fold easily under compressive or transverse stress. However, when combining a thin-walled technology such as that disclosed herein with a multi-dimensional structure such as the exemplary "tub" of FIG. 6, substantial enhancements in terms of strength are provided as will be appreciated by those of ordinary skill in the mechanical engineering arts. Stated differently, the use of a three-dimensional structure such as the tub allows for the use of a thinner material while retaining similar strength properties to much thicker applications of planar or non-dimensional structures. It will further be recognized that while a tub-like shape is shown, myriad other "dimensional" structures may be utilized consistent with the invention. For example a substantially pyramidal shape could be used, as could a semi-sphere, frusto-conic section, or the like. Similarly, a sawtooth planar or box-like shape could be used.

Figure 7:
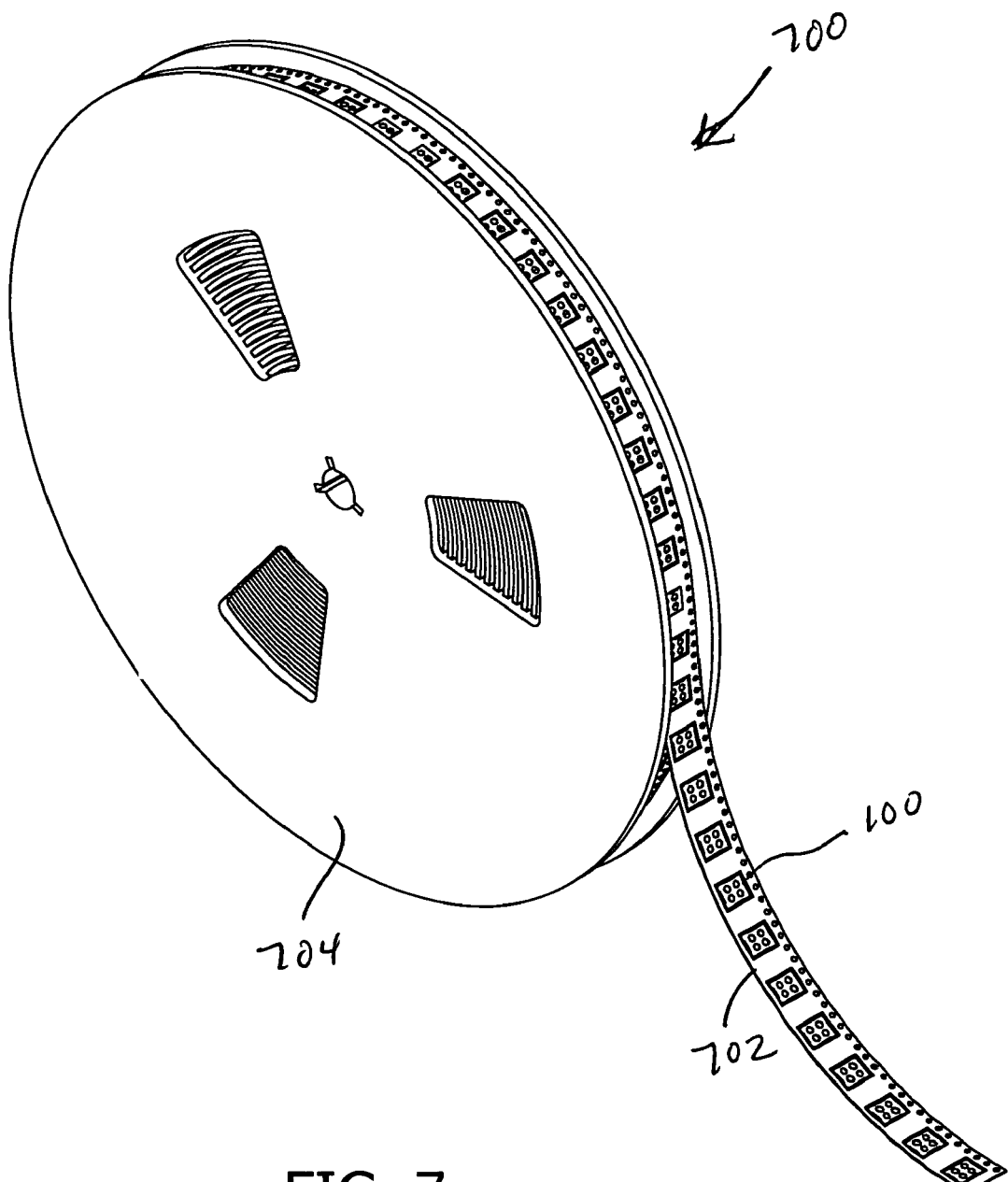
FIG. 7 is a perspective view of a carrier tape adapted to house the integrated shield structure of FIG. 1.

Referring now to FIG. 7, a carrier reel 700 carrying a plurality of integrated shield structures 100 such as those shown in FIG. 1 is shown and described in detail. The carrier reel 700 is useful for, inter alia, the automated placement of the shield structures 100 onto the electronic components with which they are to be utilized. The carrier reel 700 of this embodiment is generally similar to those ubiquitous in the electronics industry, and comprises a polymer carrier 702 wound about a polymer or fibrous (i.e. paper) reel 704. The shield structures 100 reside, in one embodiment, within cavities of the carrier 700 and are removed from the cavities via a nozzle or other implement which utilizes a vacuum pressure to remove the structures 100, and then subsequently place them with a relatively high degree of accuracy.

Figure 7A:
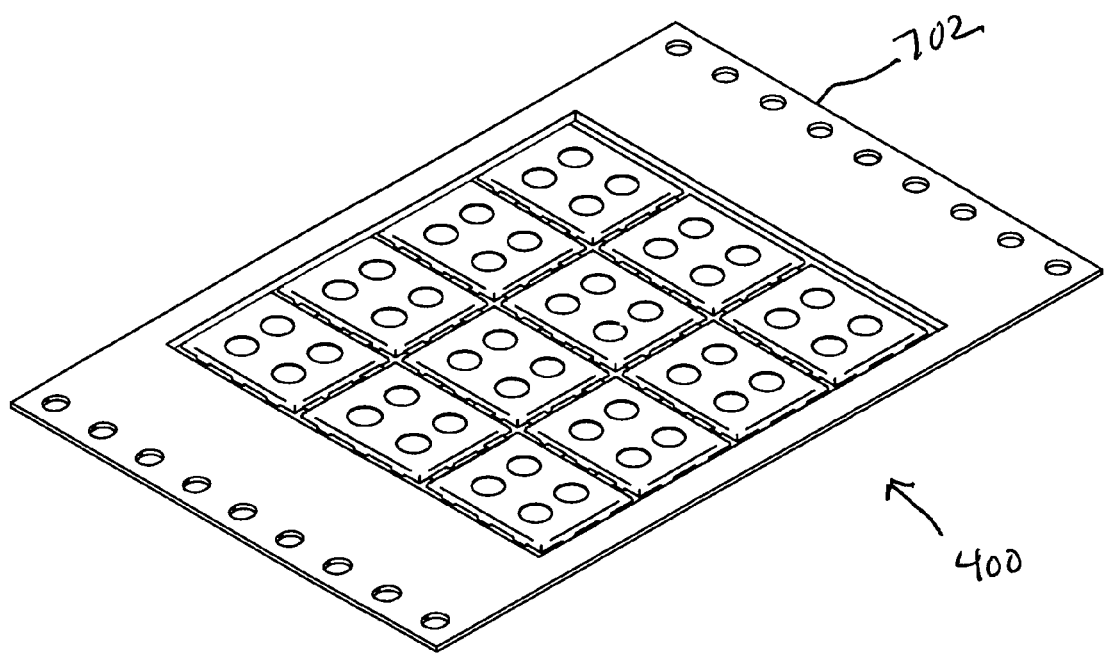
FIG. 7A is a perspective view of a carrier tape adapted to house the integrated shield array structure of FIG. 4.

FIG. 7A illustrates a second embodiment of a carrier tape 702, in which a shield structure array 400 resides. Similar to the carrier shown in FIG. 7, the shield structure array 400 can be removed from the cavity within the carrier tape 702 via a nozzle and subsequently be placed over an electronic component prior to subsequent manufacturing processes such as encapsulation and the like.

Referring now to FIGS. 8A-8D, additional embodiments of shield structures 800 according to the invention are shown and described in detail.

Figure 8A:
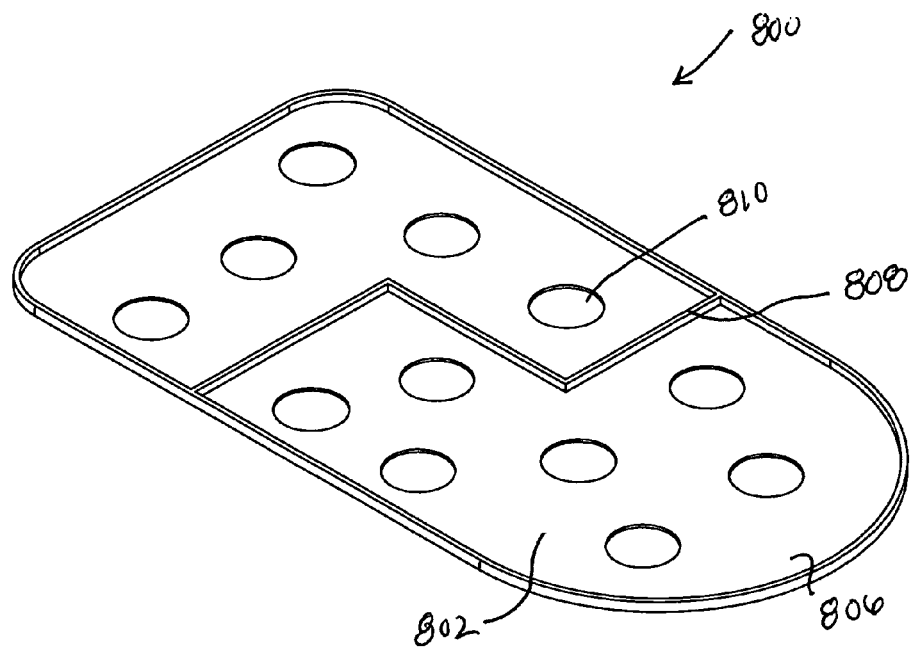
FIG. 8A is a perspective view of an alternative embodiment of an integrated shield structure manufactured in accordance with the principles of the present invention.

As can be seen in FIG. 8A, the shield structure comprises an electroformed or chemically etched base material 802 characterized by fill features 810, a cavity dividing wall 808 and an external wall 806. The profile of the integrated shield structure 800 of FIG. 8A comprises a curved profile, while the dividing wall 808 can be formed into an irregular pathway. This illustrates the advantages of the electroforming or chemical milling processes as it applies to more complex shapes unachievable using traditional prior art processes.

Figure 8B:
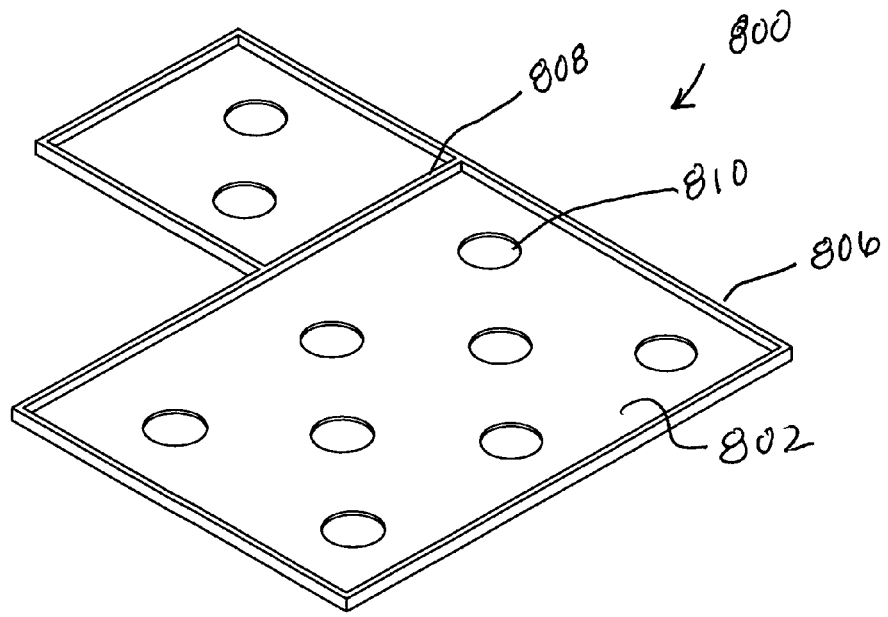
FIG. 8B is a perspective view of another alternative embodiment of an integrated shield structure manufactured in accordance with the principles of the present invention.

FIG. 8B shows yet another embodiment of a shield structure manufactured in accordance with the principles of the present invention. This approach is particularly useful for heterogeneous device sizes and/or shapes.

Figure 8C:
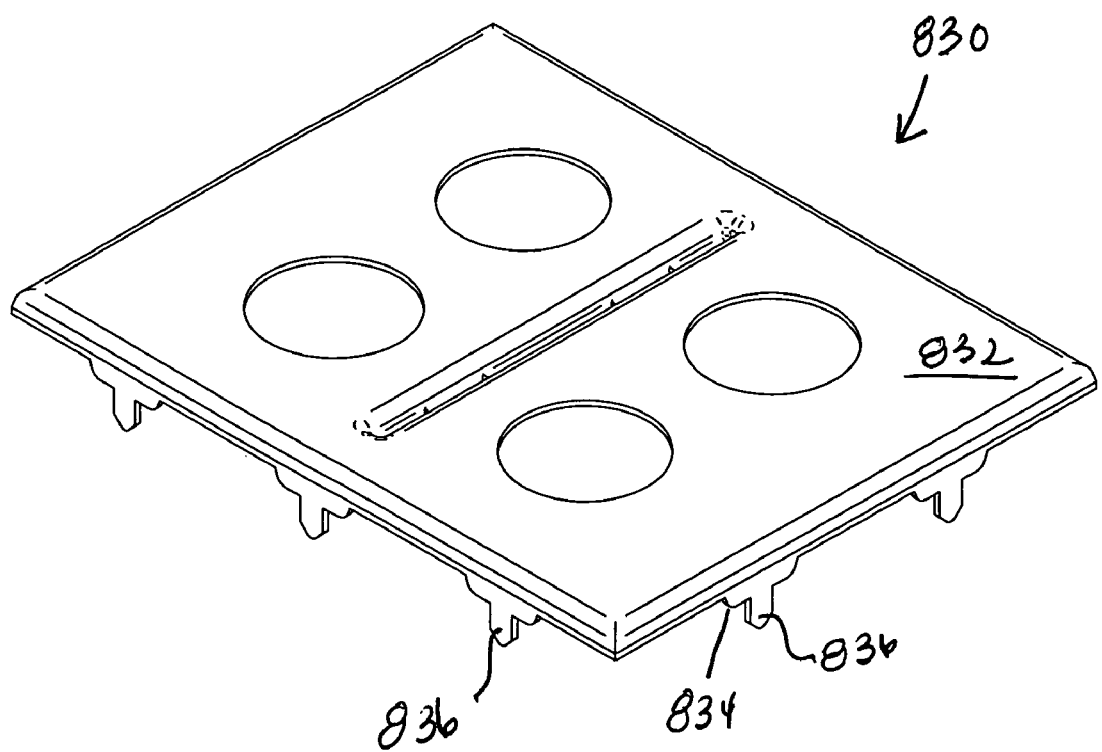
FIG. 8C is a perspective view of yet another alternative embodiment of an integrated shield structure manufactured in accordance with the principles of the present invention.

In the embodiment of FIG. 8C, a substantially planar shield element top wall 832 is used as part of the shield structure 830, and a plurality of sidewall standoffs 834 are also provided. Each (or a lesser number) of the standoffs 834 include a through-hole pin or structure 836, which may be used for mating the shield structure to another component having corresponding apertures or holes, such as a PCB. This approach advantageously places the standoffs at the periphery of the shield, and allows for rapid registration of the shield in a desired orientation or location based on the interaction of the pins 836 and their corresponding apertures (not shown). Moreover, the standoffs are shaped and sized relative to the apertures so as to automatically place the shield at a specific height above the PCB or other parent component if desired (i.e., if the standoffs are allowed to engage the top surface of the PCB).

Figure 8D:
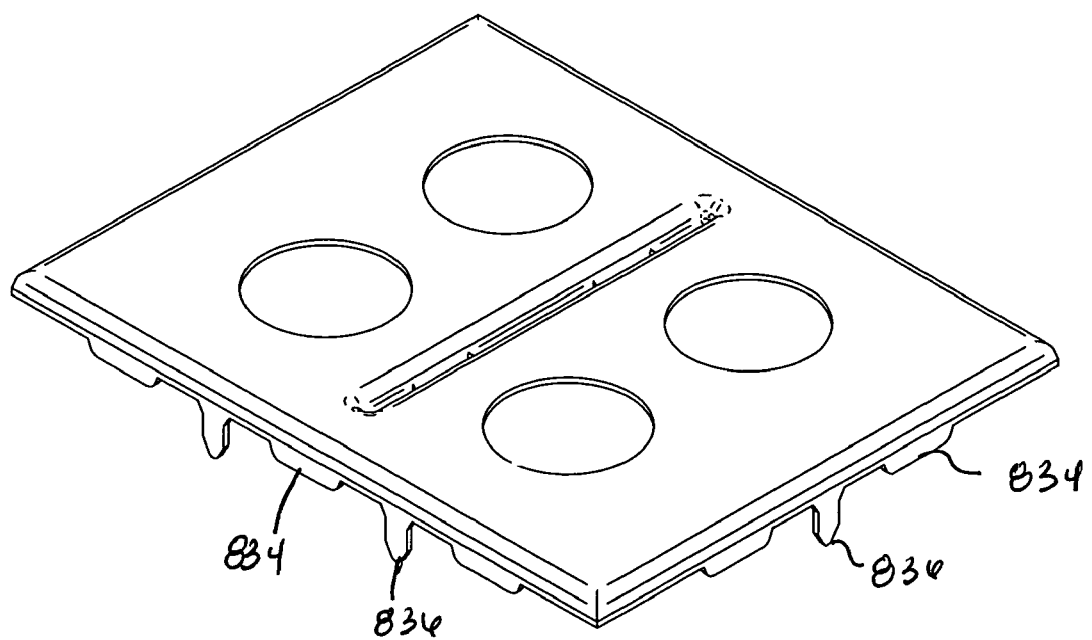
FIG. 8D is a perspective view of still another alternative embodiment of an integrated shield structure manufactured in accordance with the principles of the present invention.

In the embodiment of FIG. 8D, the through-hole pins 836 are disposed on the sidewall between the standoffs 834 as shown. Yet other configurations will be apparent to those of ordinary skill given the present disclosure.

As can be readily appreciated that different placements, shapes and geometries of pin 836 may be used consistent with the invention, including without limitation heterogeneous pins (e.g., mixes of two or more different pin configurations and/or placements).

It will be recognized that the embodiment of FIGS. 8C and 8D may also use other internal standoffs (not shown) if desired, so as to e.g., support the center region of the top wall where no other support exists. Such internal standoffs may be of the "through hole" type or not, depending on the particular application.

FIG. 8E illustrates still a further embodiment of the invention, wherein a "flat top" design having no appreciable sidewall is utilized. As shown in FIG. 8E, this shield device 850 comprises a substantially planar top wall 852, and a plurality of electroformed standoffs 856 disposed on the underside of the top wall. The standoffs may be distributed around the periphery (e.g., in place of the sidewall, as generally used in the embodiments of FIGS. 8C and 8D), and/or inside the periphery of the top wall at one or more interior locations as shown in FIG. 8E. These standoffs 856 may be for example substantially conical or frusto-conical, cylindrical, pyramidal, square or rectangular in shape, and located at literally any points within the top wall interior surface desired.

Methods of Manufacture and Use

It will be appreciated that while described primarily in terms of one or more of the structural embodiments disclosed herein, and an electroforming process, the methodologies described below may be readily generalized and abstracted to other embodiments by those of ordinary skill.

Figure 10:
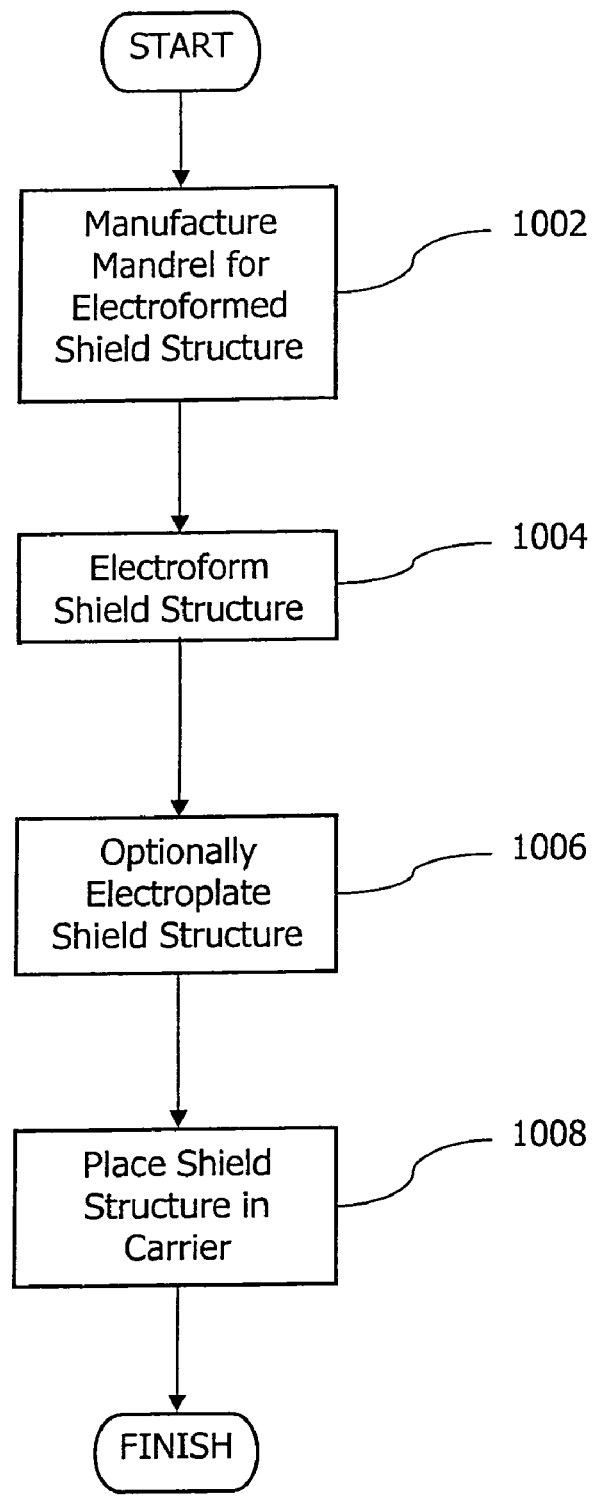
FIG. 10 is a logical flow diagram illustrating a first exemplary method for making and using an integrated shield structure in accordance with the principles of the present invention.

Referring now to FIG. 10, a first exemplary method of manufacturing and using an integrated shield structure 1000 is shown and described in detail. At step 1002, the mandrel utilized in the manufacture of the shield structure is made. The exemplary mandrel comprises a re-useable mandrel so that once manufactured, it can be reused to make multiple integrated shield structures. The mandrel will advantageously be made using precision machining techniques such as electro-discharge machining (EDM) or the like as previously described. The mandrel can be masked in appropriate places to define the boundaries for the electroformed structure.

At step 1004, the shield structure is electroformed as previously described herein, such as via e.g., electro-deposition in a plating bath.

At step 1006, the electroformed integrated shield structure is optionally plated to improve noise attenuating performance and/or increase the solder-ability of the shield structure (or even for aesthetic reasons).

At step 1008, the integrated shield structure is inserted into a carrier such as those shown in FIGS. 7-7A. The carrier provides protection for the integrated shield structure during storage and shipment and subsequently allows for automated placement of the structures on a substrate.

While the discussion of FIG. 10 has primarily been discussed in relation to discrete shield structures such as that of FIG. 1, the discussion is equally applicable to other embodiments including the integrated shield array structures of, inter alia, FIG. 4.

Figure 11:
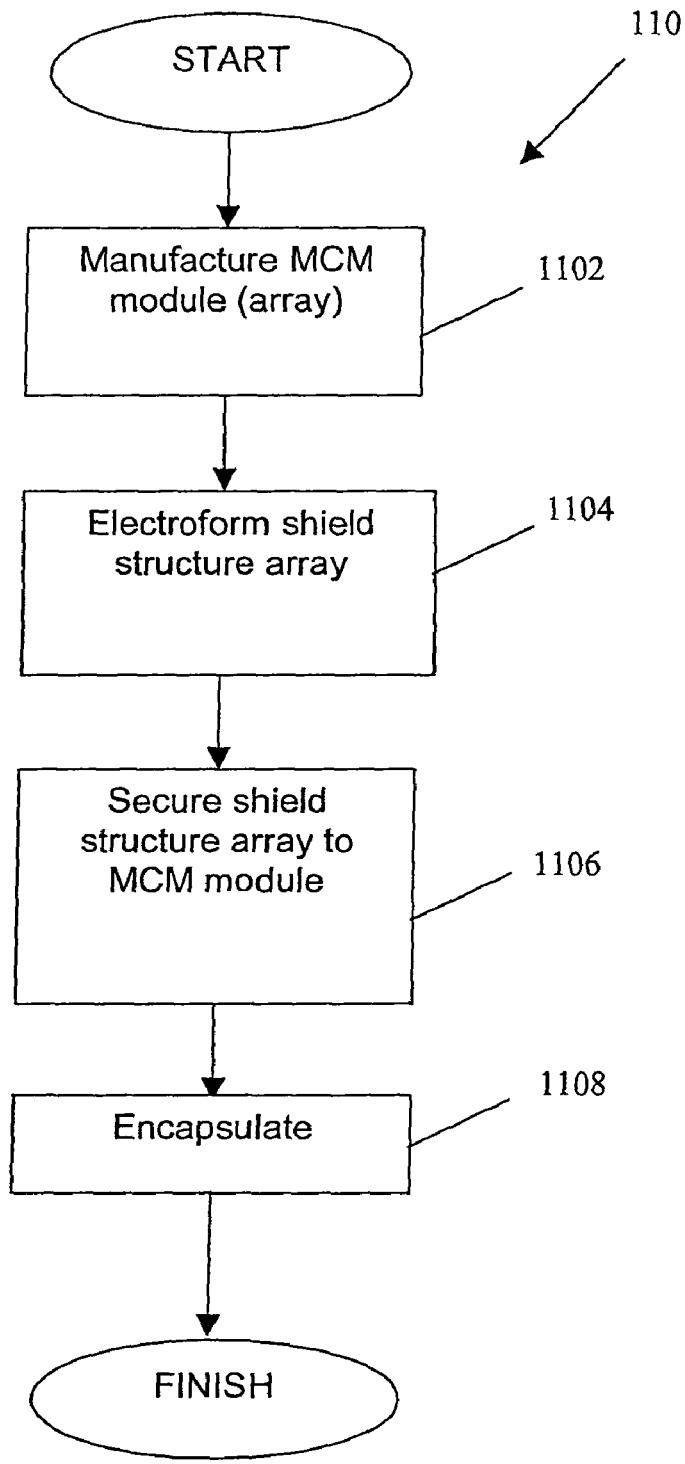
FIG. 11 is a second logical flow diagram illustrating a second exemplary method of utilizing an integrated shield structure array in accordance with the principles of the present invention.

Referring now to FIG. 11, a second exemplary method of utilizing an integrated shield array structure 1100 is shown and described in detail. At step 1102, an electronic component array, such as an MCM module, is manufactured. The specific details of the manufacturing process used to form such a module are however beyond the scope of this invention and well known to those of ordinary skill in the packaging arts, and hence are not described in further detail.

At step 1104, a shield structure array is manufactured in accordance with the principles of the present invention. In one embodiment, the shield structure array is manufactured in accordance with the process steps described with regards to FIG. 10, although other approaches may be used with equal success.

At step 1106, the shield structure array is attached to the array of electronic components such as the exemplary MCM module array discussed previously. In one embodiment, the shield structure array is placed using automated pick and place equipment and subsequently secured over the electronic component array via the use of conductive epoxy.

At step 1108, the secured shield structure array and electronic component array are placed inside of a mold and encapsulated to form a unitary assembly.

After formation, each component within the encapsulated array is subsequently separated using a saw or other separating means (e.g., laser energy, "snapping" along scores or other such features formed into the material, etc.). The encapsulated assemblies may then optionally be placed inside a carrier (such as those discussed with reference to FIGS. 7 and 7A) so that they may be stored and later processed using automated placement equipment.

It will be recognized that while certain aspects of the invention are described in terms of specific design examples, these descriptions are only illustrative of the broader methods of the invention, and may be modified as required by the particular design. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A multi-level shielding apparatus useful in the attenuation of unwanted signals, comprising:
    a top wall; and
    a plurality of standoff features;
    wherein a first surface of said top wall has been electroformed to a first level, and wherein a second surface of said top wall substantially adjacent to said first surface has been electroformed to a second level different than that of said first level; and
    wherein said first and second surfaces are disposed on a side of said top wall that is adapted to be placed substantially in communication with a plurality of integrated circuits, said first level being selected to accommodate an integrated circuit of a first height, said second level being adapted to accommodate an integrated circuit of a second height.

2. The shielding apparatus of claim 1, wherein said top wall is formed using an electroforming process, and the thickness of said top wall is less than or equal to 0.10 mm.

3. The shielding apparatus of claim 1, further comprising a divider substantially separating at least a portion of said shielding apparatus into two or more cavities.

4. The shielding apparatus of claim 1, further comprising a plurality of posts substantially separating at least a portion of said shielding apparatus into two or more cavities.

5. The shielding apparatus of claim 1, further comprising at least one encapsulant fill aperture.

6. The shielding apparatus of claim 5, wherein said at least one fill aperture is formed at least in said top wall.

7. The shielding apparatus of claim 1, wherein said plurality of standoff features comprises one or more substantially rounded edges.

8. The shielding apparatus of claim 1, wherein said plurality of standoff features comprises at least one substantially non-planar-shape.

9. The shielding apparatus of claim 8, wherein said substantially non-planar-shape comprises a tub-shape.

10. The shielding apparatus of claim 1, wherein said plurality of standoff features comprises a substantially non-planar shape selected from the group consisting of: (i) a substantially bathtub-like shape, (ii) a substantially frusto-conic section, (iii) a substantially pyramidal shape; and (iv) a substantially V-shape.

11. The shielding apparatus of claim 10, further comprising a side wall disposed substantially around at least a portion of the periphery of said top wall.

12. The shielding apparatus of claim 1, wherein said shield apparatus is adapted to at least partly receive two or more discrete electronic devices, and further comprises an element formed between at least a portion of at least two of the electronic devices in order to provide at least some shielding between them.

13. The shielding apparatus of claim 1, wherein said shielding apparatus has a height less than or equal to 0.6 mm.

14. Shield apparatus, comprising:
    an array comprising a plurality of self-supporting electroformed metallic electronic component shield elements, at least a portion of said self-supporting electroformed metallic electronic component shield elements comprising:
        a top wall; and
        a plurality of standoff features;
        wherein a first surface of said top wall has been electroformed to a first level, and wherein a second surface of said top wall substantially adjacent to said first surface has been electroformed to a second level different than that of said first level; and
        wherein said first and second surfaces are disposed on said top wall so as to be placed substantially in communication with a plurality of integrated circuits, said first level being selected to accommodate an integrated circuit of a first height, said second level being adapted to accommodate an integrated circuit of a second height; and
    a plurality of severable linkage elements formed between said shield elements.

15. The apparatus of claim 14, wherein at least one of said plurality of linkage elements is disposed between every one of said shield elements and an adjacent or neighbor shield element.

16. The apparatus of claim 14, wherein every one of said plurality of shield elements is linked to at least one other of said shield elements via at least one of said linkage elements.

17. The apparatus of claim 16, wherein said array comprises a row-and-column array, with said plurality of shield elements disposed in a common orientation within said array.

18. The apparatus of claim 14, wherein said shield elements and at least a portion of said severable links comprise an electroformed metal.

19. The apparatus of claim 14, wherein said severable elements are configured to permit severance using a dicing saw.

20. The apparatus of claim 14, wherein said severable elements are configured to permit severance via hand manipulation by a human.

21. The apparatus of claim 14, wherein said severable elements comprise a thickness substantially less than that of said shield elements.

22. The apparatus of claim 14, wherein said severable elements comprise substantially longitudinal strips having a length greater than width, said length and width each being significantly greater than a thickness (depth) thereof.

23. A multi-level electro-formed apparatus, comprising:
a top wall; and
a plurality of side walls;
wherein a first surface of said top wall has been electro-formed to a first level, and wherein a second surface of said top wall substantially adjacent to said first surface has been electroformed to a second level different than that of said first level; and
wherein said first and second surfaces are disposed so as to permit placement substantially in communication with one or more objects, said first level being selected to accommodate a first portion of said one or more objects having a first height, said second level being adapted to accommodate a second portion of said one or more objects of a second height.

24. The multi-level apparatus of claim 23, wherein the thickness of said top wall is less than or equal to 0.10 mm.

25. The multi-level apparatus of claim 23, further comprising a divider substantially separating at least a portion of said multi-level apparatus into two or more cavities.

26. The multi-level apparatus of claim 23, further comprising a plurality of posts substantially separating at least a portion of said multi-level apparatus into two or more cavities.

27. The multi-level apparatus of claim 23, further comprising at least one encapsulant fill aperture.

28. The multi-level apparatus of claim 27, wherein said at least one fill aperture is formed at least in said top wall.

29. A method of increasing the productivity of a manufacturing process used to form one or more integrated circuit device shields, the method comprising utilizing a selective metal deposition process to form one or more features on a substrate, said features selected from the group consisting of: (i) a partition dividing an interior volume of said device shield; (ii) stand-offs for said device shield; and (iii) a sidewall of said device shield;
wherein said forming of one or more device shields comprises electroforming a self-supporting metallic structure without the presence of an underlying supporting structure.

30. The method of claim 29, wherein said forming of one or more device shields comprises electroforming an array of said shields, individual ones of said shields of said array being separable from others of said array.

* * * * *